(12) United States Patent
Kaga et al.

(10) Patent No.: US 9,650,715 B2
(45) Date of Patent: *May 16, 2017

(54) METHOD OF FORMING METAL-CONTAINING FILM

(71) Applicant: Hitachi Kokusai Electric Inc., Tokyo (JP)

(72) Inventors: Yukinao Kaga, Toyama (JP); Tatsuyuki Saito, Toyama (JP); Masanori Sakai, Toyama (JP); Takashi Yokogawa, Toyama (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/697,274

(22) Filed: Apr. 27, 2015

(65) Prior Publication Data
US 2015/0225852 A1 Aug. 13, 2015

Related U.S. Application Data

(63) Continuation of application No. 13/398,523, filed on Feb. 16, 2012, now Pat. No. 9,045,825.

(30) Foreign Application Priority Data

Feb. 18, 2011 (JP) ................................ 2011-033243
Jan. 31, 2012 (JP) ................................ 2012-017827

(51) Int. Cl.
*C23C 16/34* (2006.01)
*C23C 16/40* (2006.01)
(Continued)

(52) U.S. Cl.
CPC ...... *C23C 16/45544* (2013.01); *C23C 16/308* (2013.01); *C23C 16/34* (2013.01); (Continued)

(58) Field of Classification Search
CPC .................................................. H01L 21/0228
See application file for complete search history.

(56) References Cited

U.S. PATENT DOCUMENTS 5,728,456 A * 3/1998 Adair ..................... B32B 17/06
359/359
6,372,598 B2 4/2002 Kang et al.
(Continued)

FOREIGN PATENT DOCUMENTS

JP 2010-050425 A 3/2010
WO 2007/020874 A1 2/2007
WO 2009143456 A1 11/2009

*Primary Examiner* — Victor A Mandala
*Assistant Examiner* — Regan J Rundio
(74) *Attorney, Agent, or Firm* — Volpe and Koenig, P.C.

(57) ABSTRACT

Provided are a semiconductor device manufacturing method and a substrate processing apparatus that are capable of increasing a work function of a film to be formed, in comparison with a related art. The method comprises: (a) supplying a metal-containing gas simultaneously with one selected from the group consisting of an oxygen-containing gas, a halogen-containing gas and combinations thereof into a processing chamber accommodating the substrate; and (b) supplying a nitrogen-containing gas with one of the oxygen-containing gas, the halogen-containing gas and the combinations thereof into the processing chamber.

6 Claims, 21 Drawing Sheets

(51) Int. Cl.
*C23C 16/455* (2006.01)
*H01L 21/02* (2006.01)
*C23C 16/30* (2006.01)
*C23C 16/54* (2006.01)
*H01L 21/285* (2006.01)
*C23C 16/52* (2006.01)

(52) U.S. Cl.
CPC ............ *C23C 16/40* (2013.01); *C23C 16/405* (2013.01); *C23C 16/45523* (2013.01); *C23C 16/45527* (2013.01); *C23C 16/45531* (2013.01); *C23C 16/45561* (2013.01); *C23C 16/45578* (2013.01); *C23C 16/52* (2013.01); *C23C 16/54* (2013.01); *H01L 21/0228* (2013.01); *H01L 21/02172* (2013.01); *H01L 21/02697* (2013.01); *H01L 21/28562* (2013.01)

(56) References Cited

U.S. PATENT DOCUMENTS

| | | | |
|---|---|---|---|
| 6,780,704 B1 * | 8/2004 | Raaijmakers | H01L 21/02159 257/E21.008 |
| 7,045,406 B2 | 5/2006 | Huotari et al. | |
| 7,759,746 B2 | 7/2010 | Clark | |
| 8,334,218 B2 * | 12/2012 | Van Nooten | C23C 16/045 257/E21.214 |
| 8,987,147 B2 * | 3/2015 | Ikegawa | H01L 21/02148 438/758 |
| 9,045,825 B2 * | 6/2015 | Kaga | C23C 16/308 |
| 9,330,899 B2 * | 5/2016 | Jung | H01L 21/02126 |
| 2004/0077182 A1 | 4/2004 | Lim et al. | |
| 2005/0059198 A1 | 3/2005 | Visokay et al. | |
| 2006/0189154 A1 | 8/2006 | Ahn et al. | |
| 2006/0214305 A1 | 9/2006 | Sakata et al. | |
| 2006/0231028 A1 * | 10/2006 | Otsuki | C23C 16/0218 118/719 |
| 2007/0243325 A1 | 10/2007 | Sneh | |
| 2009/0130331 A1 | 5/2009 | Asai et al. | |
| 2009/0263967 A1 | 10/2009 | Kil et al. | |
| 2009/0269941 A1 | 10/2009 | Raisanen et al. | |
| 2009/0297696 A1 | 12/2009 | Pore et al. | |
| 2009/0298377 A1 | 12/2009 | Yamazaki et al. | |
| 2010/0326818 A1 * | 12/2010 | Ikemoto | C23C 14/0063 204/192.17 |
| 2011/0028002 A1 * | 2/2011 | Hirota | C23C 16/405 438/761 |
| 2011/0099798 A1 | 5/2011 | Nilsen et al. | |

* cited by examiner

FIG. 1
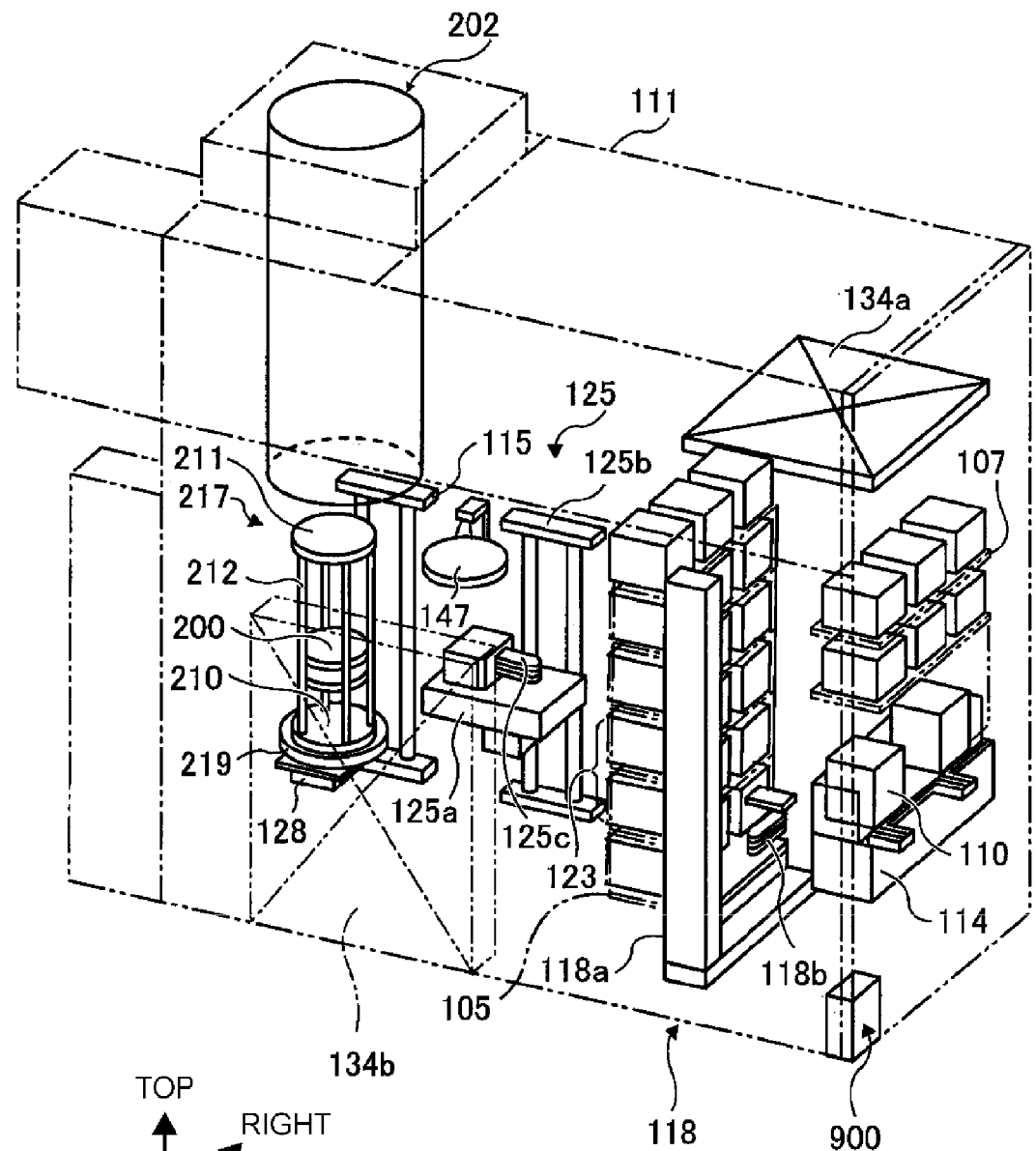
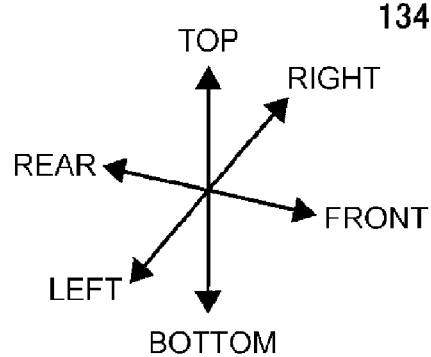

METHOD OF FORMING METAL-CONTAINING FILM

CROSS-REFERENCE TO RELATED PATENT APPLICATION

This U.S. non-provisional patent application is a continuation of U.S. patent application Ser. No. 13/398,523 filed on Feb. 16, 2012 in USPTO, and claims priority under 35 U.S.C. §119 of Japanese Patent Application No. 2011-033243 filed on Feb. 18, 2011 and Japanese Patent Application No. 2012-017827 filed on Jan. 31, 2012, in the Japanese Patent Office, the entire contents of which are hereby incorporated by reference.

BACKGROUND OF THE INVENTION

1. Field of the Invention

The present invention relates to a semiconductor device manufacturing method and a substrate processing apparatus.

2. Description of the Related Art

A process of forming a thin film on a substrate is one process in a semiconductor device manufacturing method, and processing of forming a thin film on a substrate is one example of processing by a substrate processing apparatus. One technique of forming a thin film on a substrate is a chemical vapor deposition (CVD) method. The CVD method is a method of forming a film, which is formed of an element included in a source molecule, on a substrate using a reaction of two or more kinds of source materials in a gas phase or on a substrate surface. In addition, as another technique of forming a thin film on a substrate, there is a technique in which two or more kinds of source materials used in film-forming are alternately supplied onto a substrate one by one and the film forming is controlled in the order of atomic layer using a surface reaction under certain film-forming conditions (a temperature, time, and so on).

As a metal film formed on a substrate, for example, a titanium nitride (TiN) film disclosed in Patent Document 1 may be exemplified. The TiN film may be formed by, for example, reacting titanium tetrachloride ($TiCl_4$) with ammonia ($NH_3$).

RELATED ART DOCUMENT

Patent Document

1. International Publication No. 2007/020874

SUMMARY OF THE INVENTION

However, according to a used material, a value of a work function of a film to be formed may be lower than a desired value.

It is an aspect of the present invention to provide a semiconductor device manufacturing method and a substrate processing apparatus capable of increasing a value of a work function of a film to be formed, in comparison with the related art.

In order to solve the problems, there is provided a semiconductor device manufacturing method of forming a metal-containing film on a substrate, the method comprising: (a) supplying a metal-containing gas simultaneously with one selected from the group consisting of an oxygen-containing gas, a halogen-containing gas and combinations thereof into a processing chamber accommodating the substrate; and (b) supplying a nitrogen-containing gas with one of the oxygen-containing gas, the halogen-containing gas and the combinations thereof into the processing chamber.

The semiconductor device manufacturing method may further include removing the metal-containing gas remaining in the processing chamber after performing the step (a); removing the nitrogen-containing gas remaining in the processing chamber after performing the step (b); and removing the one of the oxygen-containing gas, the halogen-containing gas and the combination thereof remaining in the processing chamber after performing the step (c).

In addition, there is provided a semiconductor device manufacturing method of forming a metal-containing film on a substrate, the method comprising: (a) simultaneously supplying a metal-containing gas and a nitrogen-containing gas into a processing chamber accommodating the substrate; and (b) supplying one selected from the group consisting of an oxygen-containing gas, a halogen-containing gas and combinations thereof into the processing chamber, wherein a time duration of supplying the metal-containing gas is shorter than that of the nitrogen-containing gas in the step (a), and the steps (a) and (b) are alternately performed as a temporally separated pulse.

Further, the present invention provides a semiconductor device manufacturing method of forming a metal-containing film on a substrate, the method including repeating a cycle a plurality of times, wherein the cycle includes: (a) supplying a metal-containing gas into a processing chamber where the substrate is accommodated; (b) supplying a nitrogen-containing gas into the processing chamber; and (c) supplying one of an oxygen-containing gas, a halogen-containing gas and a combination thereof into the processing chamber, wherein at least one of the steps (a) and (b) is performed while step (c) is performed.

Furthermore, in the semiconductor device manufacturing method, the steps (a) and (b) are alternately performed a plurality of times.

In addition, in the semiconductor device manufacturing method, the steps (a) and (b) are simultaneously performed.

Further, in the semiconductor device manufacturing method, an oxygen content or a halogen content of the metal-containing film formed on the substrate is controlled in at least one of the steps (a), (b) and (c) to be at a predetermined level.

Furthermore, there is provided a substrate processing apparatus comprising: a processing chamber configured to accommodate a substrate; a gas supply system configured to supply a metal-containing gas, a nitrogen-containing gas, and one selected from the group consisting of an oxygen-containing gas, a halogen-containing gas and combinations thereof into the processing chamber; and a controller configured to control the gas supply system to perform: (a) supplying the metal-containing gas simultaneously with the one selected from the group consisting of the oxygen-containing gas, the halogen-containing gas and the combinations thereof into the processing chamber; and (b) supplying the nitrogen-containing gas with the one selected from the group consisting of the oxygen-containing gas, the halogen-containing gas and the combinations thereof into the processing chamber.

In addition, the present invention provides a substrate processing method of forming a metal-containing film on the substrate, the method including: (a) supplying a metal-containing gas into a processing chamber where the substrate is accommodated; (b) supplying a nitrogen-containing gas into the processing chamber; and (c) supplying one of an oxygen-containing gas, a halogen-containing gas and a combination thereof into the processing chamber, wherein the step (a) and the step (b) are alternately performed a plurality of times, and the step (c) is terminated only after the step (a) and the step (b) are alternately performed the plurality of times.

According to the present invention, it is possible to provide a semiconductor device manufacturing method and a substrate processing apparatus capable of increasing a value of a work function of a film to be formed, in comparison with the related art.

BRIEF DESCRIPTION OF THE DRAWINGS

FIG. 1 is a perspective view showing a schematic configuration of a substrate processing apparatus in accordance with a first exemplary embodiment of the present invention;

DETAILED DESCRIPTION OF THE PREFERRED EMBODIMENTS

Figure 2:
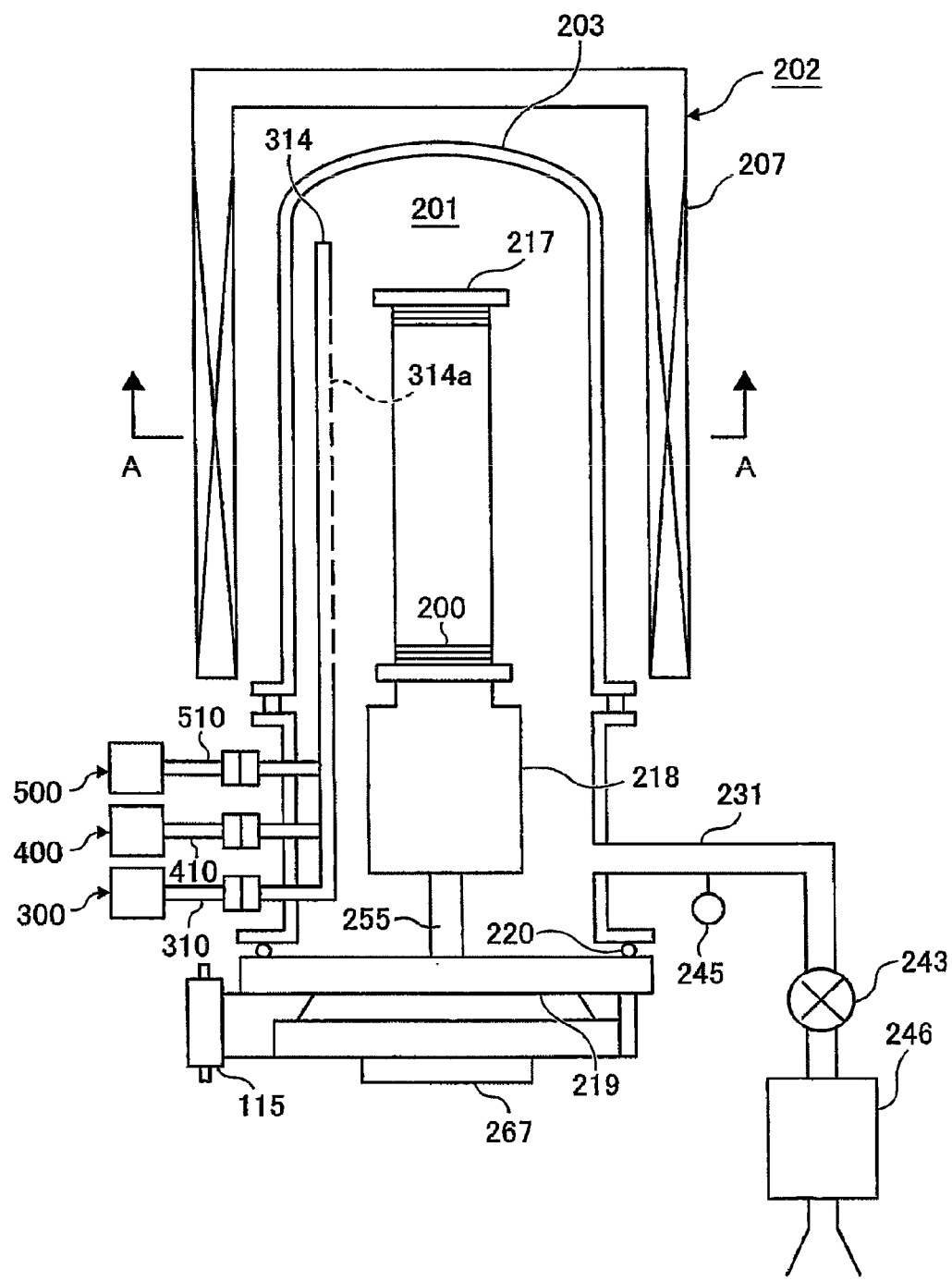
FIG. 2 is a view showing a processing furnace included in the substrate processing apparatus shown in FIG. 1.

Hereinafter, an exemplary embodiment of the present invention will be described with reference to the accompanying drawings. A substrate processing apparatus in accordance with the embodiment is configured as one example of a semiconductor manufacturing apparatus used in manufacture of a semiconductor device (integrated circuits (IC)), and a semiconductor device manufacturing method is realized in the substrate processing apparatus in accordance with the embodiment. In the following description, as one example of the substrate processing apparatus, the case in which a vertical apparatus for performing film-forming processing of a substrate is used will be described. However, the present invention is not limited to the use of the vertical apparatus, but the present invention may use, for example, a sheet-feed type apparatus.

FIG. 1 shows a substrate processing apparatus 101 in accordance with a first embodiment of the present invention. As shown in FIG. 1, a cassette 110 in which a wafer 200, which is an example of a substrate, is received is used in the substrate processing apparatus 101 and the wafer 200 is formed of a material such as silicon. The substrate processing apparatus 101 includes a housing 111, in which a cassette stage 114 is installed. The cassette 110 is loaded onto the cassette stage 114 or unloaded from the cassette stage 114 by a conveyance apparatus (not shown) in process.

The cassette stage 114 is placed by a conveyance apparatus in process such that a wafer entrance of the cassette 110 is directed upward with the wafer 200 in the cassette 110 held in a vertical posture. The cassette stage 114 is operably configured to rotate the cassette 110 rightward 90° in a longitudinal direction thereof at a rear side of the housing 111 so that the wafer 200 in the cassette 110 is in a horizontal posture and the wafer entrance of the cassette 110 is directed to the rear side of the housing 111.

A cassette shelf 105 is installed at substantially a center portion in the housing 111 in a forward/rearward direction thereof, and the cassette shelf 105 is configured to store a plurality of cassettes 110 in a multi-stage and a multi-column. A transfer shelf 123 in which the cassette 110 to be conveyed by a wafer transfer mechanism 125 is received is installed at the cassette shelf 105.

A preliminary cassette shelf 107 is installed over the cassette stage 114 to preliminarily store the cassette 110.

A cassette conveyance apparatus 118 is installed between the cassette stage 114 and the cassette shelf 105. The cassette conveyance apparatus 118 includes a cassette elevator 118a that can be raised and lowered with holding the cassette 110, and a cassette conveyance mechanism 118b, which is a conveyance mechanism. The cassette conveyance apparatus 118 is configured to convey the cassette 110 between the cassette stage 114, the cassette shelf 105 and the preliminary cassette shelf 107 by a continuous operation of the cassette elevator 118a and the cassette conveyance mechanism 118b.

The wafer transfer mechanism 125 is installed in rear of the cassette shelf 105. The wafer transfer mechanism 125 includes a wafer transfer apparatus 125a configured to rotate or move the wafer 200 straight in a horizontal direction, and a wafer transfer apparatus elevator 125b configured to raise and lower the wafer transfer apparatus 125a. Tweezers 125c configured to pick up the wafer 200 are installed at the wafer transfer apparatus 125a. The wafer transfer mechanism 125 is configured to charge the wafer 200 into a boat 217 or discharge the wafer 200 from the boat 217 using the tweezers 125c as a mounting part of the wafer 200 by a continuous operation of the wafer transfer apparatus 125a and the wafer transfer apparatus elevator 125b.

A processing furnace 202 configured to anneal the wafer 200 is installed at a rear upper side of the housing 111, and a lower end of the processing furnace 202 is configured to be opened/closed by a furnace port shutter 147.

A boat elevator 115 configured to raise and lower the boat 217 with respect to the processing furnace 202 is installed under the processing furnace 202. An arm 128 is connected to an elevation frame of the boat elevator 115, and a seal cap 219 is horizontally installed at the arm 128. The seal cap 219 is configured to close the lower end of the processing furnace 202 while vertically supporting the boat 217.

The boat 217 includes a plurality of holding members, and is configured to horizontally hold a plurality of wafers 200 (for example, 50 to 150 wafers) concentrically aligned in a vertical direction.

A clean unit 134a configured to supply clean air, which is in a clean atmosphere, is installed over the cassette shelf 105. The clean unit 134a includes a supply fan and an anti-vibration filter, and is configured to flow the clean air into the housing 111.

A clean unit 134b configured to supply clean air is installed at a left end of the housing 111. The clean unit 134b also includes a supply fan and an anti-vibration filter, and is configured to flow the clean air around the wafer transfer apparatus 125a, the boat 217, or the like. The clean air flows around the wafer transfer apparatus 125a, the boat 217, or the like, and then is exhausted to the outside of the housing 111.

In the substrate processing apparatus 101 as configured above, when the cassette 110 is loaded onto the cassette stage 114 by the conveyance apparatus (not shown) in process, the cassette 110 is placed such that the wafer 200 is held on the cassette stage 114 in a vertical posture and the wafer entrance of the cassette 110 is directed upward. Next, the cassette 110 is rotated rightward 90° in a longitudinal direction thereof at the rear side of the housing 111 such that the wafer 200 in the cassette 110 is in a horizontal posture by the cassette stage 114 and the wafer entrance of the cassette 110 is directed to the rear side of the housing 111.

Thereafter, the cassette 110 is automatically conveyed and delivered to a designated shelf position of the cassette shelf 105 or the preliminary cassette shelf 107 by the cassette conveyance apparatus 118 to be temporarily stored, and then transferred to the transfer shelf 123 from the cassette shelf 105 or preliminary cassette shelf 107 by the cassette conveyance apparatus 118 or directly conveyed to the transfer shelf 123.

When the cassette 110 is transferred to the transfer shelf 123, the wafer 200 is picked from the cassette 110 by the tweezers 125c of the wafer transfer apparatus 125a through the wafer entrance to be charged into the boat 217. The wafer transfer apparatus 125a which delivered the wafer 200 to the boat 217 returns to the cassette 110 and charges the next wafer 200 to the boat 217.

When a predetermined number of wafers 200 are charged into the boat 217, the furnace port shutter 147 that closed the lower end of the processing furnace 202 is opened to open the lower end of the processing furnace 202. Next, the boat 217 in which a group of wafers 200 are held is loaded into the processing furnace 202 by a raising operation of the boat elevator 115, and the lower portion of the processing furnace 202 is closed by the seal cap 219.

After the loading, the wafer 200 is arbitrarily processed in the processing furnace 202. After the processing, in a reverse sequence of that mentioned above, the wafer 200 and the cassette 110 are unloaded to the outside of the housing 111.

In addition, the substrate processing apparatus 101 includes a controller 900. The controller 900 is an example of a control unit (control unit) configured to control the entire operation of the substrate processing apparatus 101, and a CPU 932 (described later, see FIG. 5), which is a portion of the controller 900, is installed in, for example, the housing 111.

Figure 3:
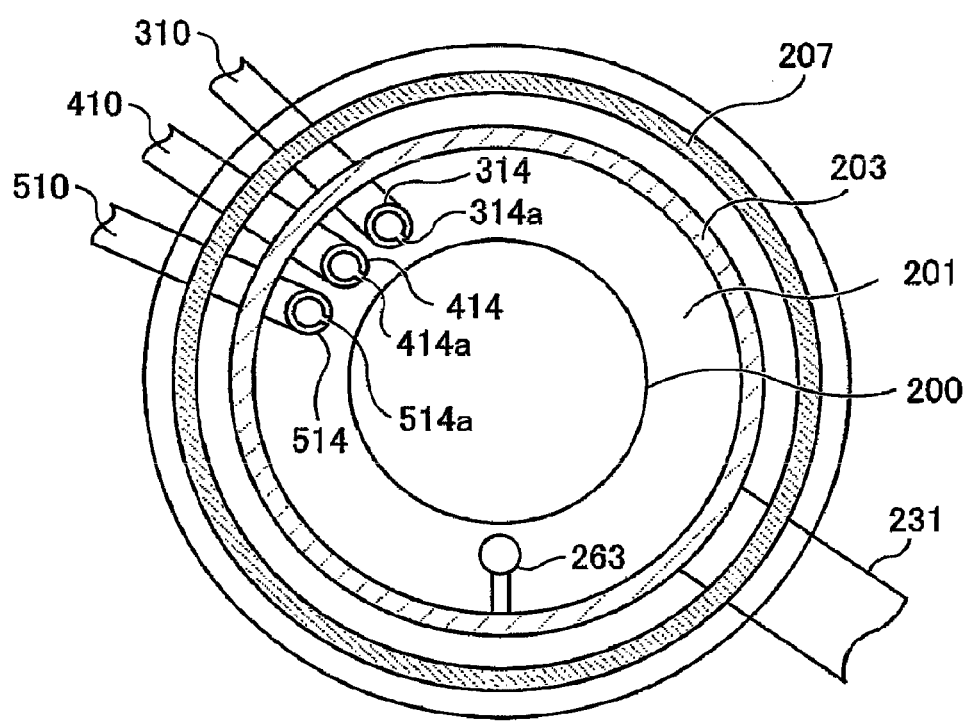
FIG. 3 is a cross-sectional view of the processing furnace taken along line A-A of FIG. 2.

FIGS. 2 and 3 show the processing furnace 202. As shown in FIGS. 2 and 3, the processing furnace 202 configures a processing chamber 201, which is an example of a processing chamber configured to accommodate the wafer 200, and a heater 207, which is a heating apparatus (heating unit) configured to heat the wafer 200, is installed at the processing furnace 202. The heater 207 includes an insulating member having a cylindrical shape with an upper side closed, and a plurality of heater wires, and has a unit in which the heater wires are installed at the insulating member. A reaction tube 203 formed of quartz and configured to process the wafer 200 is installed inside the heater 207.

The seal cap 219, which is a furnace port cover configured to hermetically close a lower end opening of the reaction tube 203, is installed under the reaction tube 203. The seal cap 219 is configured to contact the lower end of the reaction tube 203 from a lower side thereof in the vertical direction. The seal cap 219 is formed of a metal such as stainless steel and has a disc shape. An O-ring, which is a seal member in contact with the lower end of the reaction tube 203, is installed on an upper surface of the seal cap 219. A rotary mechanism 267 configured to rotate the boat is installed at the seal cap 219 opposite to the processing chamber 201. A rotary shaft 255 of the rotary mechanism 267 passes through the seal cap to be connected to the boat 217 (described later), and is configured to rotate the wafer 200 by rotation of the boat 217. The seal cap 219 is configured to be vertically raised and lowered by the boat elevator 115, which is an elevation mechanism installed outside the reaction tube 203, and thus, the boat 217 can be loaded into/unloaded from the inside of the processing chamber 201.

A boat support frame 218 configured to support the boat 217 is installed at the seal cap 219. The boat 217 includes a bottom plate 210 (see FIG. 1) fixed to the boat support frame 218 and a top plate 211 disposed over the bottom plate 210, and a plurality of columns 212 (see FIG. 1) are installed between the bottom plate 210 and the top plate 211. The plurality of wafers 200 are held on the boat 217. The plurality of wafers 200 are supported by the columns 212 of the boat 217 at predetermined intervals in a horizontal posture.

In the processing furnace 202 as described above, in a state in which the plurality of wafers 200, which are to be batch-processed, are stacked on the boat 217 in a multi-stage, the boat 217 is inserted into the processing chamber 201 with the boat 217 supported by the boat support frame 218, and the heater 207 heats the wafer 200 inserted into the processing chamber 201 to a predetermined temperature.

A temperature sensor 263, which is a temperature detector, is installed in the reaction tube 203, and is configured such that a temperature in the processing chamber 201 arrives at a desired temperature distribution by adjusting a conduction state to the heater 207 based on temperature information detected by the temperature sensor 263. The temperature sensor 263 has an L shape and is installed along an inner wall of the reaction tube 203.

The boat 217 is installed at a center portion in the reaction tube 203. The boat 217 is raised and lowered (goes in/come out) with respect to the reaction tube 203 by the boat elevator 115. A boat rotary mechanism 267 configured to rotate the boat 217 to improve processing uniformity is installed at a lower end of the boat support frame 218 configured to support the boat 217. As the boat rotary mechanism 267 is driven, the boat 217 supported by the boat support frame 218 can be rotated.

In addition, as shown in FIGS. 2 and 3, the substrate processing apparatus 101 includes a first gas supply system 300, a second gas supply system 400 and a third gas supply system 500.

The first gas supply system 300 is used as one example of a first gas supply system configured to supply a metal-containing gas into the processing chamber 201, and includes a first gas supply pipe 310. One end of the first gas supply pipe 310 is disposed inside the processing chamber 201, and the other end is disposed outside the processing chamber 201. In addition, the first gas supply system 300 includes a first nozzle 314.

The first nozzle 314 is connected to the one end of the first gas supply pipe 310, and extends in an arc-shaped space between the inner wall of the reaction tube 203 and the wafer 200, which constitute the processing chamber 201, in a vertical direction along the inner wall of the reaction tube 203 (in a stack direction of the wafers 200). Further, a plurality of gas supply holes 314a configured to supply a metal-containing gas are formed in a side surface of the first nozzle 314. The gas supply holes 314a having the same opening size or gradually varied opening areas are formed in the first nozzle 314 from a lower portion to an upper portion thereof at predetermined opening pitches.

The second gas supply system 400 is used as a second gas supply system configured to supply a nitrogen-containing gas into the processing chamber 201, and includes a second gas supply pipe 410. One end of the second gas supply pipe 410 is disposed inside the processing chamber 201, and the other end is disposed outside the processing chamber 201. In addition, the second gas supply system 400 includes a second nozzle 414.

The second nozzle 414 is connected to one end of the second gas supply pipe 410, and extends in an arc-shaped space between the inner wall of the reaction tube 203 and the wafer 200, which constitute the processing chamber 201, in the vertical direction along the inner wall of the reaction tube 203 (in the stack direction of the wafers 200). In addition, a plurality of gas supply holes 414a configured to supply a nitrogen-containing gas are formed in a side surface of the second nozzle 414. The gas supply holes 414a having the same opening size or gradually varied opening areas are formed in the second nozzle 414 from a lower portion to an upper portion thereof at predetermined opening pitches.

The third gas supply system 500 is used as a third gas supply system configured to supply one of an oxygen-containing gas, a halogen-containing gas and a combination thereof into the processing chamber 201, and includes a third gas supply pipe 510. One end of the third gas supply pipe 510 is disposed inside the processing chamber 201, and the other end is disposed outside the processing chamber 201. In addition, the third gas supply system 500 includes a third nozzle 514.

The third nozzle 514 is connected to the one end of the third gas supply pipe 510, and extends in an arc-shaped space between the inner wall of the reaction tube 203 and the wafer 200, which constitute the processing chamber 201, in the vertical direction along the inner wall of the reaction tube 203 (in the stack direction of the wafers 200). In addition, a plurality of gas supply holes 514a configured to supply an oxygen-containing gas are formed in a side surface of the third nozzle 514. The gas supply holes 514a having the same opening size or gradually varied opening areas are formed in the third nozzle 514 from a lower portion to an upper portion thereof at predetermined opening pitches.

Figure 4:
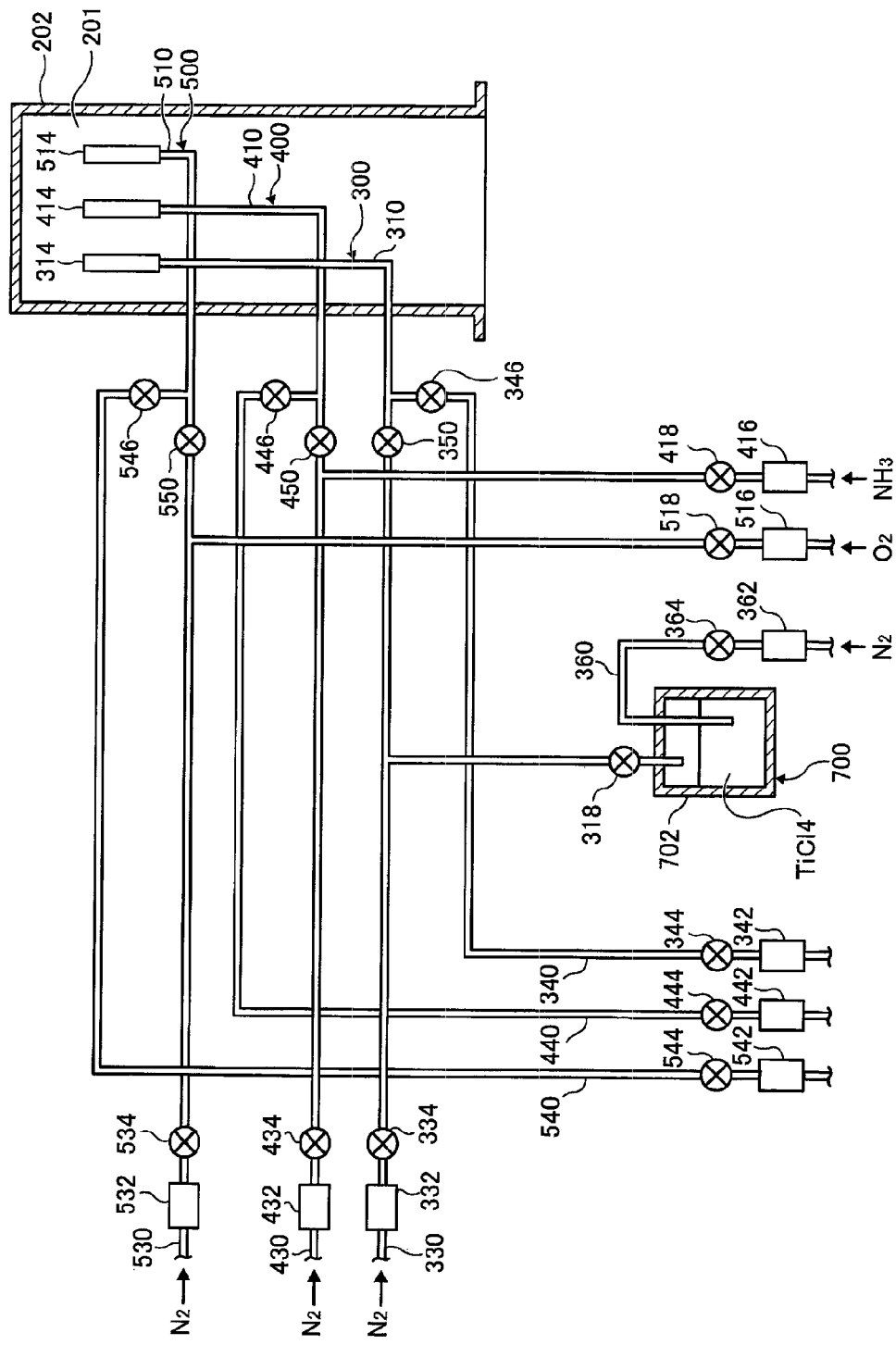
FIG. 4 is a view schematically showing a first gas supply system, a second gas supply system and a third gas supply system included in the substrate processing apparatus shown in FIG. 1.

FIG. 4 shows the first gas supply system 300, the second gas supply system 400 and the third gas supply system 500.

As shown in FIG. 4, the first gas supply system 300 includes the first gas supply pipe 310, a bubbler 700 connected to the gas supply pipe 310, and a valve 318 installed in the gas supply pipe 310 at an upstream side of the bubbler 700.

The bubbler 700 includes an accommodating vessel 702 configured to accommodate a liquid source material, and is used as one example of an evaporator configured to generate a source gas by evaporating the liquid source material through bubbling. The accommodating vessel 702 is a sealed vessel, and $TiCl_4$ (titanium tetrachloride), which is an example of the liquid source material, is accommodated in the accommodating vessel 702.

A carrier gas supply pipe 360 is connected to the accommodating vessel 702. A carrier gas supply source (not shown) is connected to an upstream side of the carrier gas supply pipe 360. In addition, a downstream side end of the carrier gas supply pipe is immersed in the liquid source material accommodated in the accommodating vessel 702. Further, a mass flow controller 362 configured to control a supply flow rate of a carrier gas supplied from a carrier gas supply source and a valve 364 used to stop or initiate supply of the carrier gas are mounted on the carrier gas supply pipe 360.

A gas that does not react with the liquid source material may be used as the carrier gas supplied using the carrier gas supply pipe 360, for example, an inert gas such as $N_2$ gas or Ar gas may be used.

The valve 318 is used to stop or initiate supply of the source gas from the bubbler 700.

In addition, the first gas supply system 300 includes a carrier gas supply pipe 330, a mass flow controller 332 and a valve 334. The carrier gas supply pipe 330 is used to supply a carrier gas, and is connected to the first gas supply pipe 310. The mass flow controller 332 and the valve 334 are mounted on the carrier gas supply pipe 330 in a sequence of the mass flow controller 332 and the valve 334 from an upstream side. For example, $N_2$ gas is used as the carrier gas supplied through the carrier gas supply pipe 330.

Further, the first gas supply system 300 includes a cleaning gas supply pipe 340, a mass flow controller 342, a valve 344 and a valve 346. The cleaning gas supply pipe 340 is used to supply a cleaning gas, and connected to the first gas supply pipe 310 at a downstream side of a position to which the bubbler 700 is connected. The mass flow controller 342, the valve 344 and the valve 346 are mounted on the cleaning gas supply pipe 340 in a sequence of the mass flow controller 342, the valve 344 and the valve 346 from an upstream side.

Furthermore, the first gas supply system 300 includes a valve 350. The valve 350 is mounted on the first gas supply pipe 310 at a downstream side of a position to which the carrier gas supply pipe 330 is connected and an upstream side of a position to which the cleaning gas supply pipe 340 is connected.

The first gas supply system 300 configured as above supplies TiCl$_4$ gas, which is an example of a metal-containing gas, into the processing chamber 201. Instead of the configuration of the first gas supply system 300 to supply TiCl$_4$ gas into the processing chamber 201, the first gas supply system 300 may be configured to supply tetrakisdimethylaminotitanium (TDMAT, Ti[N(CH$_3$)$_2$]$_4$) or tetrakisdiethylaminotitanium (TDEAT, Ti[N(CH$_2$CH$_3$)$_2$]$_4$) into the processing chamber 201.

The second gas supply system 400 includes the second gas supply pipe 410, a mass flow controller 416 and a valve 418. A supply source of NH$_3$ (ammonia) gas (not shown) is connected to an upstream side end of the second gas supply pipe 410. The mass flow controller 416 and the valve 418 are mounted on the second gas supply pipe 410 in a sequence of the mass flow controller 416 and the valve 418 from an upstream side. The mass flow controller 416 is used as an example of a flow rate control apparatus (flow rate control unit), and the valve 418 is used as an example of an opening/closing valve.

In addition, the second gas supply system 400 includes a carrier gas supply pipe 430, a mass flow controller 432 and a valve 434. The carrier gas supply pipe 430 is used to supply a carrier gas and connected to the second gas supply pipe 410. The mass flow controller 432 and the valve 434 are mounted on the carrier gas supply pipe 430 in a sequence of the mass flow controller 432 and the valve 434 from an upstream side. For example, N$_2$ gas is used as the carrier gas supplied through the carrier gas supply pipe 430.

Further, the second gas supply system 400 includes a cleaning gas supply pipe 440, a mass flow controller 442, a valve 444 and a valve 446. The cleaning gas supply pipe 440 is used to supply a cleaning gas and is connected to the second gas supply pipe 410. The mass flow controller 442, the valve 444 and the valve 446 are mounted on the cleaning gas supply pipe 440 in a sequence of the mass flow controller 442, the valve 444 and the valve 446 from an upstream side.

In addition, the second gas supply system 400 includes a valve 450. The valve 450 is mounted on the second gas supply pipe 410 at a downstream side of a position to which the carrier gas supply pipe 430 is connected and an upstream side of a position to which the cleaning gas supply pipe 440 is connected.

The second gas supply system 400 configured as above supplies NH$_3$ gas, which is an example of a nitrogen-containing gas, into the processing chamber 201. Instead of the configuration of the second gas supply system 400 to supply the NH$_3$ gas into the processing chamber 201, the second gas supply system 400 may be configured to supply N$_2$ (nitrogen) gas, N$_2$O (nitrous oxide) gas, CH$_6$N$_2$ (monomethylhydrazine) gas, etc., into the processing chamber 201.

The third gas supply system 500 includes the third gas supply pipe 510, a mass flow controller 516 and the valve 518. A supply source of O$_2$ (oxygen) gas is connected to an upstream side end of the third gas supply pipe 510. The mass flow controller 516 and the valve 518 are mounted on the third gas supply pipe 510 in a sequence of the mass flow controller 516 and the valve 518 from an upstream side. The mass flow controller 516 is used as one example of the flow rate control apparatus (flow rate control unit), and the valve 518 is used as an opening/closing valve. Instead of the configuration of the third gas supply system 500 to supply the O$_2$ gas into the processing chamber 201, the third gas supply system 500 may be configured to supply the N$_2$O (nitrous oxide) gas, etc., into the processing chamber 201.

Further, the third gas supply system 500 includes a carrier gas supply pipe 530, a mass flow controller 532 and a valve 534. The carrier gas supply pipe 530 is used to supply a carrier gas and is connected to the third gas supply pipe 510. The mass flow controller 532 and the valve 534 are mounted on the carrier gas supply pipe 530 in a sequence of the mass flow controller 532 and the valve 534 from an upstream side. For example, N$_2$ gas is used as the carrier gas supplied through the carrier gas supply pipe 530.

Furthermore, the third gas supply system 500 includes a cleaning gas supply pipe 540, a mass flow controller 542, a valve 544 and a valve 546. The cleaning gas supply pipe 540 is used to supply a cleaning gas and connected to the third gas supply pipe 510. The mass flow controller 542, the valve 544 and the valve 546 are mounted on the cleaning gas supply pipe 540 in a sequence of the mass flow controller 542, the valve 544 and the valve 546 from an upstream side.

In addition, the third gas supply system 500 includes a valve 550. The valve 550 is mounted on the third gas supply pipe 510 at a downstream side of a position to which the carrier gas supply pipe 530 is connected and an upstream side of a position to which the cleaning gas supply pipe 540 is connected.

A gas supply method in the embodiment is clearly distinguished from the conventional method of directly supplying a gas from one end of a lower side or an upper side of the reaction tube 203 into an arc-shaped elongated space defined by the inner wall of the reaction tube 203 and ends of the plurality of wafers 200 to flow the gas from the lower side to the upper side or from the upper side to the lower side so that each of the wafers 200 stacked in the reaction tube 203 reacts with the flowing gas. In this case, at an area adjacent to a gas supply part, the amount of gas is relatively increased (a concentration of the gas is relatively increased), and a film thickness of the thin film formed on the wafer 200 disposed at the area is increased. Meanwhile, at an area far away from the gas supply part, since the amount of gas that can arrive at the wafer 200 is reduced (the concentration of the gas is relatively increased), the film thickness of the thin film formed on the wafer 200 disposed at the area is reduced. Accordingly, since a difference in film thickness of the thin film generated between upper and lower sides of the wafers 200 stacked in the reaction tube 203 occurs, the conventional gas supply method is not preferable to a vertical batch-type apparatus.

Meanwhile, the gas supply method in the embodiment is characterized in that a gas is conveyed via the nozzles 314, 414 and 514 disposed in the arc-shaped space, the gas is initially ejected into the reaction tube 203 and around the wafer 200 through the gas supply hole 314a, 414a and 514a opened at the nozzle 314, 414 and 514, and a main flow of the gas in the reaction tube 203 is parallel to a surface of the wafer 200, i.e., a horizontal direction. As a result, the gas can be uniformly supplied to each of the wafers 200, and the film thickness of the thin film formed on each of the wafers 200 can be uniformized. In addition, while the remaining gas after the reaction flows toward an exhaust port. i.e., in a direction of an exhaust pipe 231, which will be described later, the flow direction of the remaining gas is not limited to the vertical direction but may be appropriately specified by a position of the exhaust port.

The exhaust pipe 231 configured to exhaust an atmosphere in the processing chamber 201 is installed at the reaction tube 203. As shown in FIG. 3, when seen from a lateral cross-sectional view, the exhaust pipe 231 is installed at a side of the reaction tube 203 opposite to a side in which the gas supply hole 314a of the first nozzle 314, the gas supply hole 414a of the second nozzle 414 and the gas supply hole 514a of the third nozzle 514 are formed, i.e., an opposite side of the gas supply holes 314a, 414a and 514a with the wafer 200 interposed therebetween. In addition, the exhaust pipe 231 is installed under positions in which the gas supply holes 314a, 414a and 515a are formed. According to the configuration, the gas supplied around the wafer 200 in the processing chamber 201 through the gas supply holes 314a. 414a and 514a flows in a horizontal direction, i.e., in a direction parallel to the surface of the wafer 200, flows downward, and then is exhausted through the exhaust pipe 231. Similar to that described above, a main flow of the gas in the processing chamber 201 becomes a flow in a horizontal direction. A vacuum pump 246, which is a vacuum exhaust apparatus, is connected to the exhaust pipe 231 via a pressure sensor 245, which is a pressure detector (a pressure detecting part) configured to detect a pressure in the processing chamber 201, and an automatic pressure controller (APC) valve 243, which is a pressure regulator (a pressure regulating part), so that the pressure in the processing chamber 201 is vacuum-exhausted to a predetermined pressure (a degree of vacuum). In addition, the APC valve 243 is an opening/closing valve configured to open/close a valve to perform the vacuum-exhaust and stop the vacuum-exhaust in the processing chamber 201, and adjust a valve opening angle to regulate the pressure. An exhaust system is mainly constituted by the exhaust pipe 231, the APC valve 243, the vacuum pump 246 and the pressure sensor 245.

Figure 5:
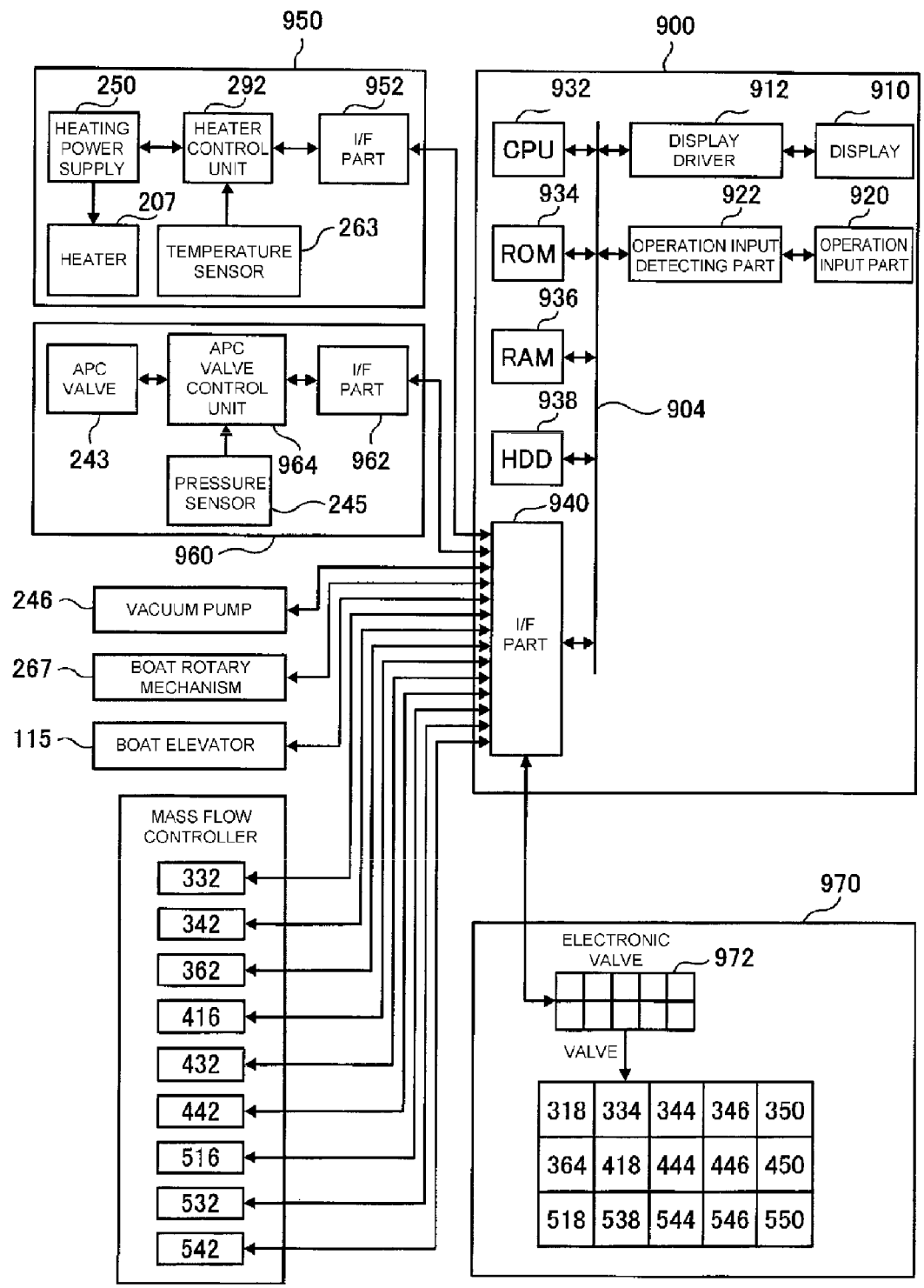
FIG. 5 is a block diagram showing a controller and members controlled by the controller, which are included in the substrate processing apparatus shown in FIG. 1.

FIG. 5 shows the controller 900. The controller 900 controls the first gas supply system 300, the second gas supply system 400 and the third gas supply system 500 such that an oxygen content or a halogen content included in the metal-containing film formed on the wafer 200 is at a predetermined level.

In addition, the controller 900 includes a display 910 configured to display operation menus, and an operation input part 902 having a plurality of keys and into which various information and operation orders are input. Further, the controller 900 includes a CPU 932 configured to process the entire operation of the substrate processing apparatus 101, a ROM 934 in which various programs including a control program are previously stored, a RAM 936 configured to temporarily store various data, an HDD 938 configured to store and hold various data, a display driver 912 configured to control display of various information to the display 910 and receive operation information from the display 910, an operation input detection part 922 configured to detect an operation state of the operation input part 920, and a communication interface (I/F) part 940.

The communication I/F part 940 performs transmission and reception of various information to/from various members such as a temperature control unit 950 (described later), a pressure control unit 960 (described later), the vacuum pump 246, the boat rotary mechanism 267, the boat elevator 115, the mass flow controllers 322, 342, 362, 416, 432, 442, 516, 532 and 542, and a valve control unit 970 (described later).

The CPU 932, the ROM 934, the RAM 936, the HDD 938, the display driver 912, the operation input detection part 922 and the communication I/F part 940 are connected to each other via a system bus 904. For this reason, the CPU 932 can perform access to the ROM 934, the RAM 936 and the HDD 938, control of display of various information to the display 910 via the display driver 912 and recognition of operation information from the display 910, and control of transmission and reception of various information to/from each member via the communication I/F part 940. In addition, the CPU 932 can recognize an operation state of a use with respect to the operation input part 920 via the operation input detection part 922.

The temperature control unit 950 includes the heater 207, a heating power source 250 configured to supply power to the heater 207, the temperature sensor 263, a communication I/F part 952 configured to transmit and receive various information such as set temperature information to/from the controller 900, and a heater control unit 292 configured to control power supply from the heating power source 250 to the heater 207 based on the received set temperature information and the temperature information from the temperature sensor 263. The heater control unit 292 is realized by a computer. The communication I/F part 952 of the temperature control unit 950 is connected to the communication I/F part 940 of the controller 900 via a cable.

The pressure control unit 960 includes the APC valve 243, the pressure sensor 245, a communication I/F part 962 configured to transmit and receive various information such as set pressure information and opening/closing information of the APC valve 243 to/from the controller 900, and an APC valve control unit 964 configured to control opening/closing or an opening angle of the APC valve 243 based on the set pressure information, opening/closing information of the APC valve 243, and pressure information from the pressure sensor 245. The APC valve control unit 964 is realized by the computer. The communication I/F part 962 of the pressure control unit 960 is connected to the communication I/F part 940 of the controller 900 via a cable.

The valve control unit 970 includes the valves 318, 334, 344, 346, 350, 364, 428, 444, 446, 450, 518, 534, 544, 546 and 550, and an electromagnetic valve group 972 configured to control supply of air to the valves 318, 334, 344, 346, 350, 364, 428, 444, 446, 450, 518, 534, 544, 546 and 550, which are air valves. The electromagnetic valve group 972 is connected to the communication I/F part 940 of the controller 900 via a cable.

As described above, the controller 900 is connected to each of the members such as the mass flow controllers 332, 342, 362, 416, 432 and 442, the valves 318, 334, 344, 346, 350, 364, 418, 444, 446, 450, 518, 534, 544, 546 and 550, the APC valve 243, the heating power source 250, the temperature sensor 263, the pressure sensor 245, the vacuum pump 246, the boat rotary mechanism 267 and the boat elevator 115. In addition, the controller 900 is configured to perform a flow rate control of the mass flow controllers 332, 342, 362, 416, 432 and 442, an opening/closing operation control of the valves 318, 334, 344, 346, 350, 364, 418, 444, 446, 450, 518, 534, 544, 546 and 550, a pressure control through an opening angle adjusting operation based on pressure information from the pressure sensor 245, a temperature control through a power supply amount adjusting operation from the heating power source 250 to the heater 207 based on temperature information from the temperature sensor 263, an initiation and stoppage control of the vacuum pump 246, a rotational speed adjusting control of the boat rotary mechanism 267, and an elevation operation control of the boat elevator 115.

Hereinafter, an example of a method of forming a film on a substrate when a large scale integration (LSI) is manufactured, which is one process of manufacturing a semiconductor device, using the processing furnace 202 of the substrate processing apparatus will be described. In addition, in the following description, operations of the members constituting the substrate processing apparatus are controlled by the controller 900.

In the embodiment, a method of forming a titanium oxynitride (TiON) film, in which oxygen is added (doped) to a titanium nitride film, which is a metal film, on a substrate using a method of alternately supplying a plurality of processing gases will be described. In the embodiment, for example, $TiCl_4$ is used as a titanium (Ti)-containing element and $NH_3$ is used as a nitriding gas. In the example, a titanium-containing gas supply system (a first element-containing gas supply system) is constituted by the first gas supply system 300, a nitrogen-containing gas supply system (a second element-containing gas supply system) is constituted by the second gas supply system 400, and an oxygen-containing gas supply system (a third element-containing gas supply system) is constituted by a third gas supply system 500.

Figure 6:
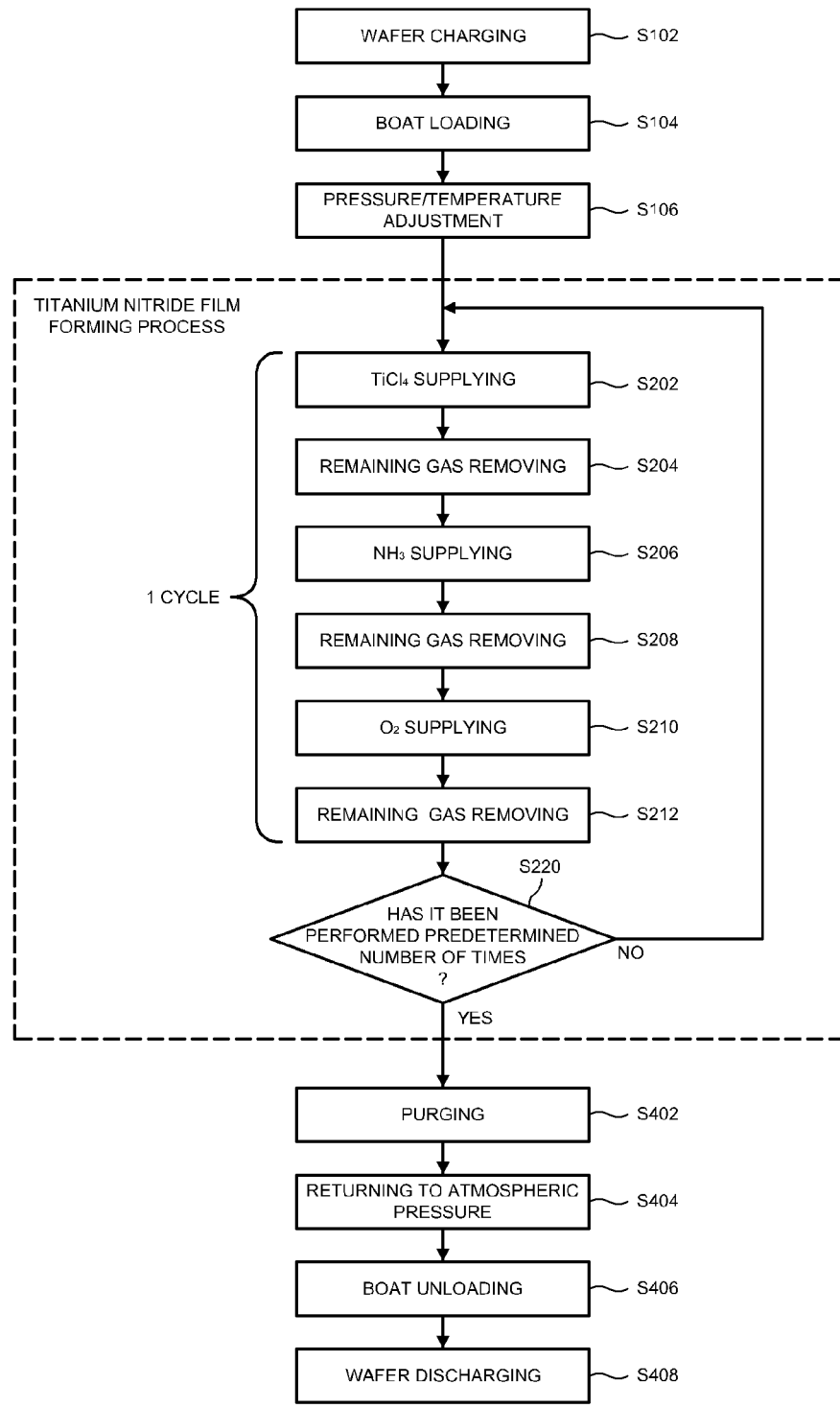
FIG. 6 is a flowchart showing an example of control in the first embodiment of the present invention.

FIG. 6 shows an example of a control flow in the embodiment. The first gas supply system 300, the second gas supply system 400 and the third gas supply system 500 are controlled by the control flow such that an oxygen content or a halogen content included in the metal-containing film formed on the wafer 200 is at a predetermined level. In addition, in the control flow, the controller 900 controls the substrate processing apparatus 101 as follows. That is, the heater 207 is controlled to maintain the inside of the processing chamber 201 at a temperature of, for example, 300° C. to 550° C., preferably, 450° C. or less, and more preferably, 450° C.

In addition, wafer charging is performed in step S102. That is, the plurality of wafers 200 are charged into the boat 217.

In the following step S104, boat loading is performed. That is, the boat 217 on which the plurality of wafers 200 are supported is raised by the boat elevator 115 to be loaded into the processing chamber 201. In this state, the seal cap 219 seals the lower end of the reaction tube 203 via an O-ring 220. Next, the boat 217 is rotated by a boat driving mechanism 267 to rotate the wafer 200. Next, as the vacuum pump 246 is operated, the APC valve 243 is opened to vacuum-exhaust the inside of the processing chamber 201, and when a temperature of the wafer 200 arrives at 450° C. and is stably maintained (pressure and temperature adjustment, S106), the next steps are sequentially performed in a state in which the temperature in the processing chamber 201 is maintained at 450° C.

In step (S202), $TiCl_4$ is supplied. $TiCl_4$ is a liquid at a normal temperature. For this reason, in order to supply it into the processing chamber 201, $N_2$ (nitrogen), which is an inert gas, used as one example of a carrier gas passes through the accommodating vessel 702 using the bubbler 700, and is supplied into the processing chamber 201 with the carrier gas to an extent of evaporation. Instead of $N_2$, He (helium), Ne (neon) and Ar (argon) may be used as the carrier gas.

More specifically, in step S202, the $TiCl_4$ flows through the first gas supply pipe 310 and the carrier gas ($N_2$) flows through the carrier gas supply pipe 330. At this time, the valve 362, the valve 318 of the first gas supply pipe 310, the valve 334 of the carrier gas supply pipe 330 and the APC valve 243 of the exhaust pipe 231 are opened together. The carrier gas flows through the carrier gas supply pipe 330 to be flow rate-controlled by the mass flow controller 332. The $TiCl_4$ flows through the first gas supply pipe 310 to be flow rate-adjusted through the mass flow controller 362 by adjusting a flow rate of the carrier gas supplied into the accommodating vessel 702, mixed with the flow rate-adjusted carrier gas, supplied into the processing chamber 201 through the gas supply hole 314a of the first nozzle 314 to flow on the surface of the wafer 200 in a horizontal direction, and then exhausted through the exhaust pipe 231. Here, a main flow of the gas in the processing chamber 201 becomes a flow in a horizontal direction, i.e., in a direction parallel to the surface of the wafer 200. In addition, at this time, the APC valve 243 is appropriately adjusted to maintain the pressure in the processing chamber 201 within a range of 20 to 50 Pa, for example, 30 Pa. A supply amount of $TiCl_4$ controlled by the mass flow controller 362 is, for example, 1.0 to 2.0 g/min. A time of exposing the wafer 200 to the $TiCl_4$ is about 3 to 10 seconds. Here, the temperature of the heater 207 is set such that the temperature of the wafer is within a range of 300° C. to 550° C., for example, 450° C.

In step S202, the gas flowing into the processing chamber 201 contains $TiCl_4$ and $N_2$, which is an inert gas, and there is no $NH_3$. Accordingly, $TiCl_4$ does not cause a gas phase reaction but surface-reacts with a surface or a lower base film of the wafer 200.

In step S202, when the valve 434 is opened and the inert gas flows through the carrier gas supply pipe 430 connected to the middle of the second gas supply pipe 410, $TiCl_4$ can be prevented from entering the $NH_3$ side. In addition, when the valve 534 is opened and the inert gas flows through the carrier gas supply pipe 530 connected to the middle of the third gas supply pipe 510, $TiCl_4$ can be prevented from entering the $O_2$ side.

In the next step S204, the remaining gas is removed. That is, in a state in which the valve 318 of the first gas supply pipe 310 is closed to stop supply of the $TiCl_4$ into the processing chamber 201 and the APC valve 243 of the exhaust pipe 231 is opened, the inside of the processing chamber 201 is exhausted by the vacuum pump 246 to 20 Pa or less, and the remaining $TiCl_4$ is eliminated from the inside of the processing chamber 201. In addition, here, the gas remaining in the processing chamber 201 may not be completely eliminated, and the inside of the processing chamber 201 may not be completely purged. When an amount of the gas remaining in the processing chamber 201 is very small, there is no bad influence on step 2 performed thereafter. Here, there is no need to increase a flow rate of $N_2$ gas supplied into the processing chamber 201 to a large flow rate. For example, as substantially the same amount of gas as a volume of the reaction tube 203 (the processing chamber 201) is supplied, the purge can be performed to an extent in which there is no bad influence on step S206. As described above, as the inside of the processing chamber 201 is not completely purged, the purge time can be reduced and throughput can be improved. In addition, consumption of the $N_2$ gas can be suppressed to a minimum level.

In the next step S206, $NH_3$ is supplied. That is, the $NH_3$ flows through the second gas supply pipe 410 and the carrier gas ($N_2$) flows through the carrier gas supply pipe 430. Here, the valve 418 of the second gas supply pipe 410, the valves 434 and 450 of the carrier gas supply pipe 430 and the APC valve 243 of the exhaust pipe 231 are opened together. The carrier gas flows through the carrier gas supply pipe 430 to be flow rate-adjusted by the mass flow controller 432. The $NH_3$ flows through the second gas supply pipe 410 to be flow rate-adjusted by the mass flow controller 416, is mixed with the flow rate-adjusted carrier gas to be supplied into the processing chamber 201 through the gas supply hole 414a of the second nozzle 414, flows on the wafer 200 in a horizontal direction, and then is exhausted through the exhaust pipe 231. Here, a main flow of the gas in the processing chamber 201 becomes a flow in a horizontal direction, i.e., in a direction parallel to the surface of the wafer 200. In addition, when the $NH_3$ flows, the APC valve 243 is appropriately adjusted to maintain the pressure in the processing chamber 201 within a range of 50 to 1000 Pa, for example, 60 Pa. A supply flow rate of the $NH_3$ controlled by the mass flow controller 416 is within a range of, for example, 1 to 10 slm. A time of exposing the wafer 200 to $NH_3$ is for example, 10 to 30 seconds. The temperature of the heater 207 at this time is a predetermined temperature within a range of 300° C. to 550° C., for example, 450° C.

In step S206, when the valve 334 is opened to flow an inert gas through the carrier gas supply pipe 330 connected to the middle of the first gas supply pipe 310, the $NH_3$ can be prevented from entering the $TiCl_4$ side. In addition, when the valve 534 is opened to flow the inert gas through the carrier gas supply pipe 530 connected to the middle of the third gas supply pipe 510, the $NH_3$ can be prevented from entering the $O_2$ side.

In step S206, as the $NH_3$ is supplied, the $TiCl_4$ and $NH_3$ are reacted with each other on the wafer 200 to form a titanium nitride (TiN) film on the wafer 200.

In the next step S208, the remaining gas is removed. That is, the valve 418 of the second gas supply pipe 410 is closed to stop supply of the $NH_3$. In addition, in a state in which the APC valve 243 of the exhaust pipe 231 is kept open, the processing chamber 201 is exhausted by the vacuum pump 246 to 20 Pa or less, and the remaining $NH_3$ is eliminated from the processing chamber 201. In addition, here, the gas remaining in the processing chamber 201 may not be completely eliminated, and the inside of the processing chamber 201 may not be completely purged. When an amount of the gas remaining in the processing chamber 201 is very small, there is no bad influence on step S210 performed thereafter. Here, there is no need to increase a flow rate of $N_2$ gas supplied into the processing chamber 201 to a large flow rate. For example, as substantially the same amount of gas as a volume of the reaction tube 203 (the processing chamber 201) is supplied, the purge can be performed to an extent in which there is no bad influence on step S210. As described above, as the inside of the processing chamber 201 is not completely purged, the purge time can be reduced and throughput can be improved. In addition, consumption of the $N_2$ gas can be suppressed to a minimum level.

In the next step S210, $O_2$ is supplied. That is, the $O_2$ flows through the third gas supply pipe 510, and the carrier gas ($N_2$) flows through the carrier gas supply pipe 530. At this time, the valves 518 and 550 of the third gas supply pipe 510, the valves 534 and 550 of the carrier gas supply pipe 530 and the APC valve 243 of the exhaust pipe 231 are opened together. The carrier gas flows through the carrier gas supply pipe 530 to be flow rate-adjusted by the mass flow controller 532. The $O_2$ flows through the third gas supply pipe 510 to be flow rate-adjusted by the mass flow controller 516, is mixed with the flow rate-adjusted carrier gas to be supplied into the processing chamber 201 through the gas supply hole 514a of the third nozzle 514, flows on the surface of the wafer 200 in a horizontal direction, and then is exhausted through the exhaust pipe 231. Here, a main flow of the gas in the processing chamber 201 becomes a flow in a horizontal direction, i.e., in a direction parallel to the surface of the wafer 200. When the $O_2$ flows, the APC valve 243 is appropriately adjusted to maintain the pressure in the processing chamber 201 within a range of 50 to 1,000 Pa, for example, 60 Pa.

In step S210, when the valve 334 is opened to flow the inert gas through the carrier gas supply pipe 330 connected to the middle of the first gas supply pipe 310, the $O_2$ can be prevented from entering the $TiCl_4$ side. In addition, when the valve 434 is opened to flow the inert gas through the carrier gas supply pipe 430 connected to the middle of the second gas supply pipe 410, the $O_2$ can be prevented from entering the $NH_3$ side.

In step S210, As the $O_2$ is supplied onto the titanium nitride (TiN) film, a titanium oxynitride (TiON) film is formed on the substrate. The TiON film has a higher work function than the TiN film. For this reason, for example, while Ru (ruthenium) has a much higher work function than Ti, the film having a relatively high work function can be formed, with no use of an expensive material.

In the next step S212, the remaining gas is removed. That is, the valve 518 of the third gas supply pipe 510 is closed to stop supply of the $O_2$. In addition, in a state in which the APC valve 243 of the exhaust pipe 231 is kept open, the processing chamber 201 is exhausted by the vacuum pump 246 to 20 Pa or less to eliminate the remaining $O_2$ from the processing chamber 201. In addition, here, the gas remaining in the processing chamber 201 may not be completely eliminated, and the inside of the processing chamber 201 may not be completely purged. When an amount of the gas remaining in the processing chamber 201 is very small, there is no bad influence on the next gas supply step. Here, there is no need to increase a flow rate of $N_2$ gas supplied into the processing chamber 201 to a large flow rate. For example, as substantially the same amount of gas as a volume of the reaction tube 203 (the processing chamber 201) is supplied, the purge can be performed to an extent in which there is no bad influence on the next gas supply step. As described above, as the inside of the processing chamber 201 is not completely purged, the purge time can be reduced and throughput can be improved. In addition, consumption of the $N_2$ gas can be suppressed to a minimum level.

In the next step S220, it is determined whether a series of steps from S202 to S212 have been performed a predetermined number of times. When it is determined that the steps have been performed the predetermined number of times, the next step S402 is performed, and when it is determined that the steps have not been performed the predetermined number of times, the process returns to step S202.

In the film-forming process including steps S202 to S212 as described above, the TiON film is formed.

In the next step S402, the purge is performed (purging). In the next step S404, returning to an atmospheric pressure is performed. That is, the atmosphere in the processing chamber 201 is replaced with the inert gas, and the pressure in the processing chamber 201 returns to the normal pressure (returning to the atmospheric pressure).

In the next step S406, boat unloading is performed. That is, the seal cap 219 is lowered by the boat elevator 115 to open the lower end of the reaction tube 203, and simultaneously, the processed wafer 200 supported on the boat 217 is unloaded from the lower end of the reaction tube 203 to the outside of the reaction tube 203 (boat unloading).

In the next step S408, wafer discharging is performed. That is, the processed wafer 200 is discharged from the boat 217 (wafer discharging). As described above, one film-forming processing (batch processing) is completed. In addition, after the completion of the film-forming processing, a cleaning gas may be appropriately supplied according to an amount of byproducts stuck to the inside of the reaction tube 203 to perform gas cleaning.

Figure 7:
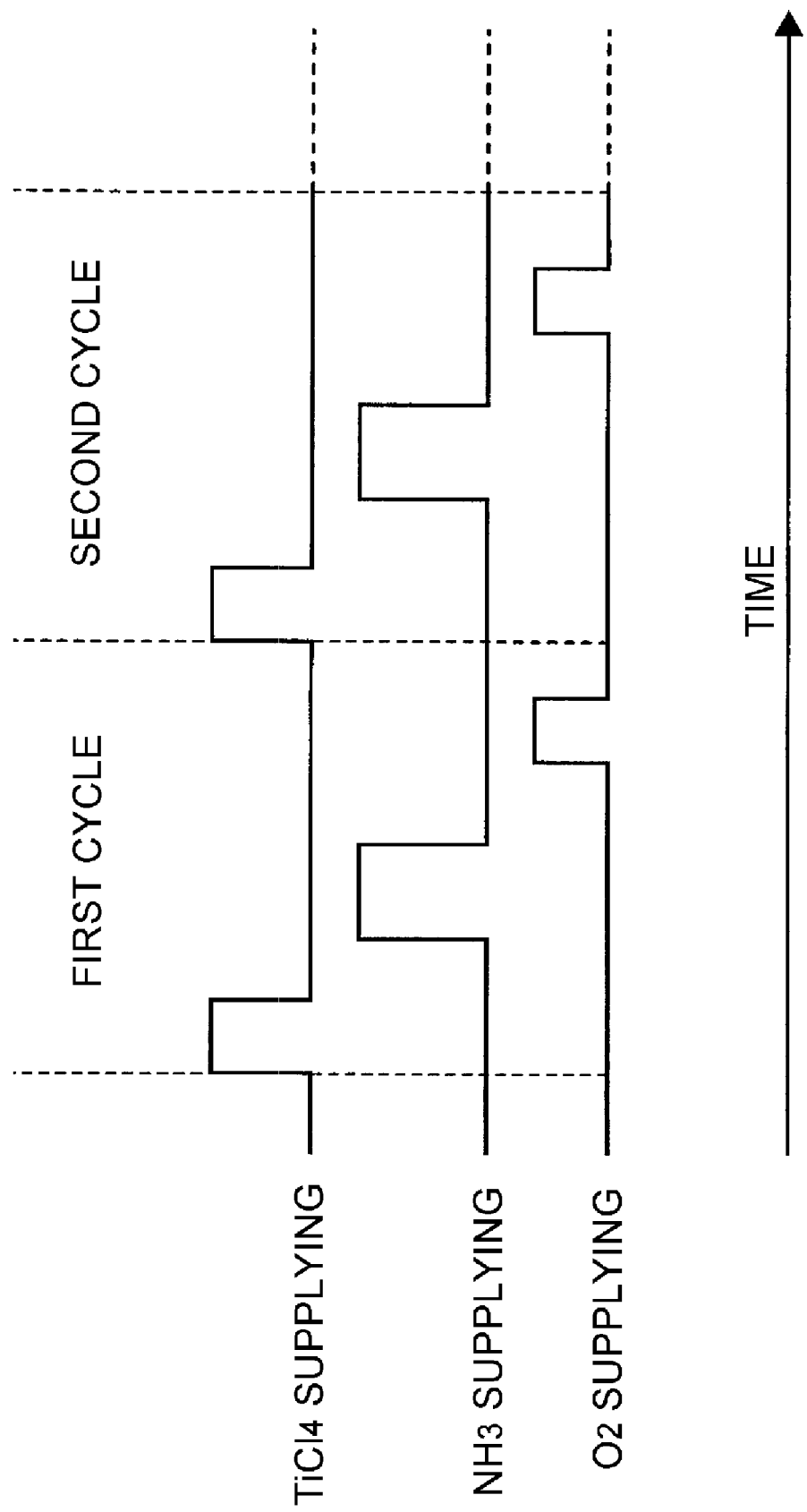
FIG. 7 is a timing chart showing a sequence of a film-forming process in the first embodiment of the present invention.

FIG. 7 is a timing chart showing a film-forming sequence of the TiON film in the film-forming process. The sequence corresponds to steps S202 to S220. As shown in FIG. 7, in the film-forming process, a process of supplying $TiCl_4$ gas, which is a metal-containing gas, a process of supplying $NH_3$ gas, which is a nitrogen-containing gas, and a process of supplying $O_2$ gas, which is an oxygen-containing gas, are set as one cycle, and the cycle is repeated a predetermined number of times. Here, the number of cycles is determined according to a film thickness of a film to be formed, for example, when a film-forming rate is 1 Å/cycle, a film of 20 Å can be formed by performing 20 cycles.

Figure 8:
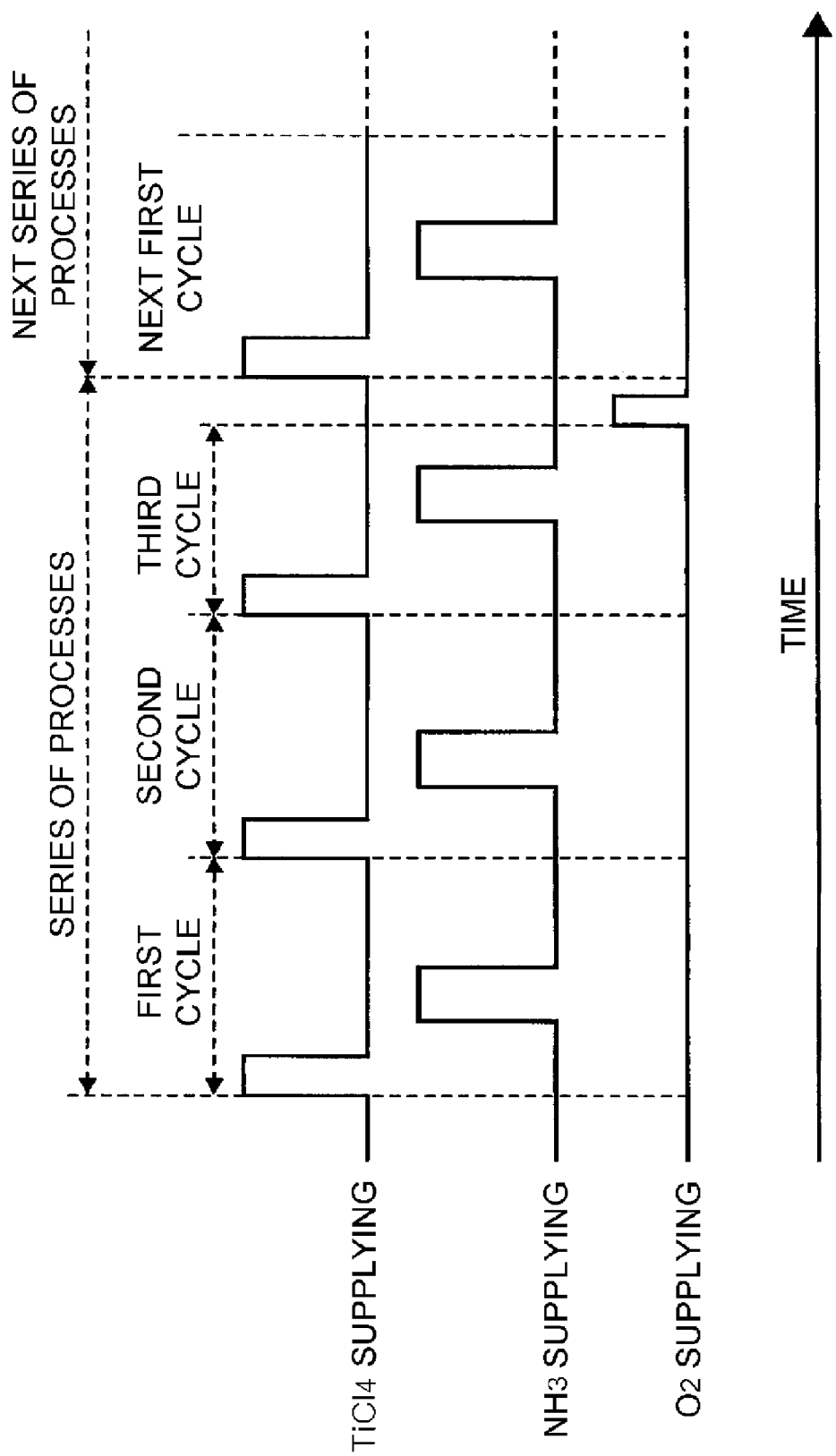
FIG. 8 is a timing chart showing a first variant of the film-forming process in the first embodiment of the present invention.

FIG. 8 is a timing chart showing a first variant of the film-forming sequence in the film-forming process in accordance with the embodiment. In the film-forming sequence of the TiON film in the film-forming process in accordance with the embodiment, the process of supplying $TiCl_4$ gas, which is a metal-containing gas, the process of supplying $NH_3$ gas, which is a nitrogen-containing gas, and the process of supplying $O_2$ gas, which is an oxygen-containing gas, were set as one cycle, and the cycle was repeated a predetermined number of times. On the other hand, in the first variant, a process of supplying $TiCl_4$ gas, which is a metal-containing gas, and a process of supplying $NH_3$ gas, which is a nitrogen-containing gas, are set as one cycle, the cycle is repeated a plurality of times (3 times in the first variant), and then a process of supplying $O_2$ gas, which is an oxygen-containing gas, is performed.

In addition, in the first variant, the process of supplying $TiCl_4$ gas, which is a metal-containing gas, and the process of supplying $NH_3$ gas, which is a nitrogen-containing gas, are set as one cycle, the cycle is performed a plurality of times (3 times in the first variant) and then the process of supplying $O_2$ gas, which is an oxygen-containing gas, is performed, the series of processes are set as one cycle, and the cycle including the series of processes is repeated a plurality of times.

The first variant of the film-forming sequence in the film-forming process is realized by controlling the respective members of the substrate processing apparatus 101 using the controller 900.

Figure 9:
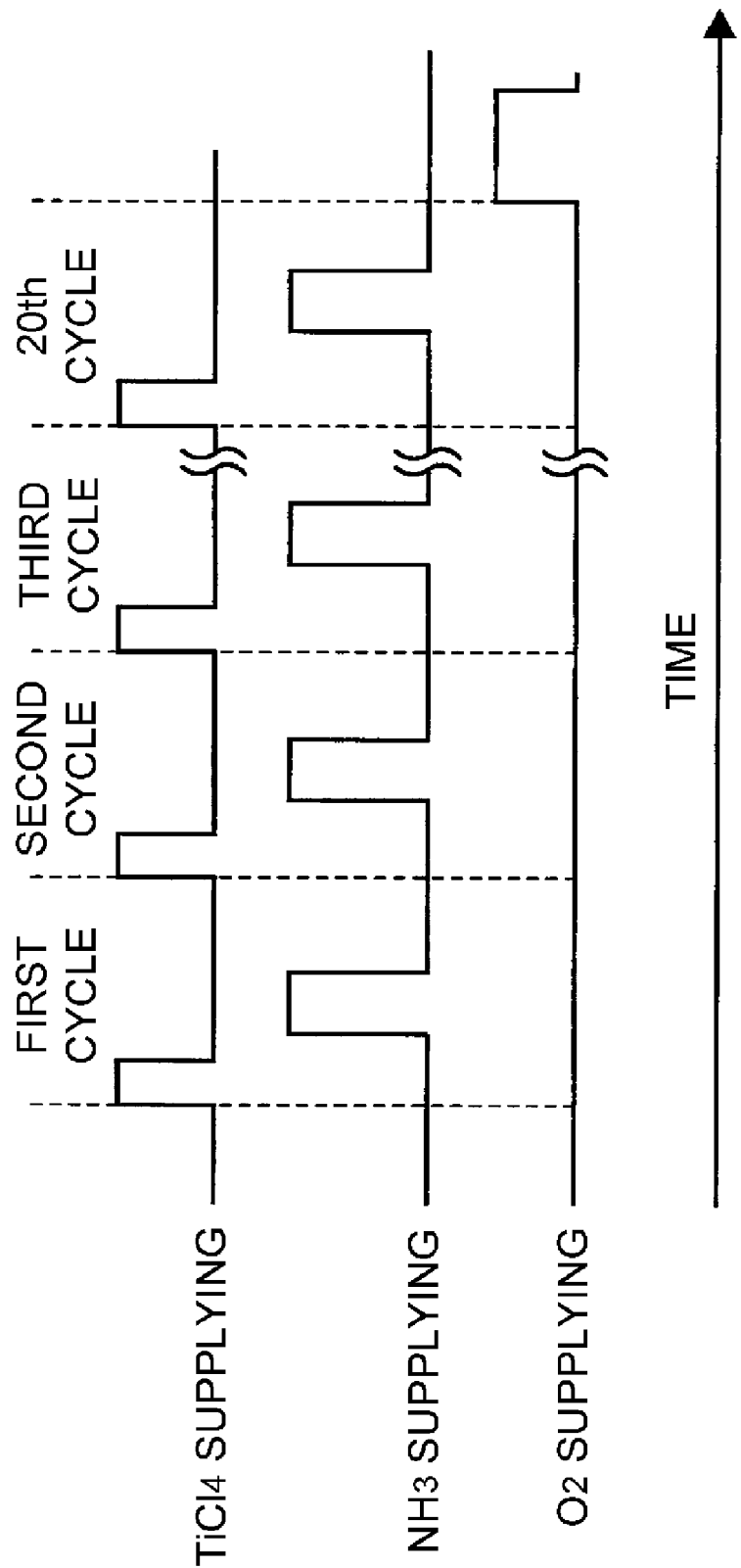
FIG. 9 is a timing chart showing a second variant of the film-forming process in the first embodiment of the present invention.

FIG. 9 is a timing chart showing a second variant of the film-forming sequence in the film-forming process in accordance with the embodiment. In the film-forming sequence of the TiON film in the film-forming process in accordance with the embodiment, the process of supplying $TiCl_4$ gas, which is a metal-containing gas, the process of supplying $NH_3$ gas, which is a nitrogen-containing gas, and the process of supplying $O_2$ gas, which is an oxygen-containing gas, were set as one cycle, and the cycle was repeated a predetermined number of times. On the other hand, in the second variant, a process of supplying $TiCl_4$ gas, which is a metal-containing gas, and a process of supplying $NH_3$ gas, which is a nitrogen-containing gas, are set as one cycle, the cycle is repeated a plurality of times (20 times in the first variant), and then a process of supplying $O_2$ gas, which is an oxygen-containing gas, is performed, completing a series of film-forming processes.

The second variant of the film-forming sequence in the film-forming process is realized by controlling the respective members of the substrate processing apparatus 101 using the controller 900.

Figure 10:
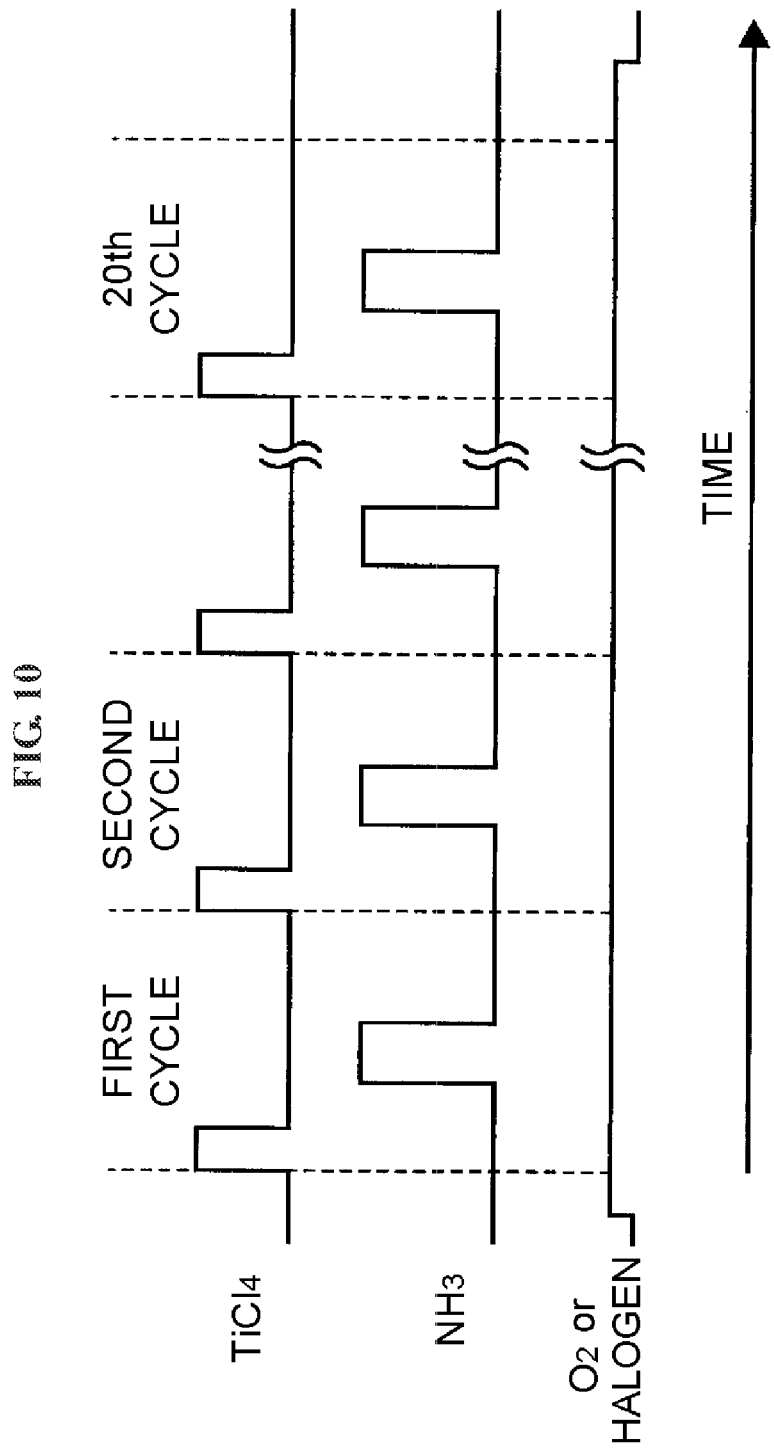
FIG. 10 is a timing chart showing a third variant of the film-forming process in the first embodiment of the present invention.

FIG. 10 is a timing chart showing a third variant of the film-forming sequence in the film-forming process in accordance with the embodiment. In the film-forming sequence of the TiON film in the film-forming process in accordance with the embodiment, the process of supplying $TiCl_4$ gas, which is a metal-containing gas, the process of supplying $NH_3$ gas, which is a nitrogen-containing gas, and the process of supplying $O_2$ gas, which is an oxygen-containing gas, were set as one cycle, and the cycle was repeated a predetermined number of times. On the other hand, in the third variant, a process of supplying $TiCl_4$ gas, which is a metal-containing gas, and a process of supplying $NH_3$ gas, which is a nitrogen-containing gas, are performed while a process of supplying $O_2$ gas, which is an oxygen-containing gas, is performed.

In addition, in the third variant, the process of supplying $TiCl_4$ gas, which is a metal-containing gas, and the process of supplying $NH_3$ gas, which is a nitrogen-containing gas, are set as one cycle, and the cycle is performed a plurality of times (20 times in the third variant).

The third variant of the film-forming sequence in the film-forming process is realized by controlling the respective members of the substrate processing apparatus 101 using the controller 900.

Figure 11:
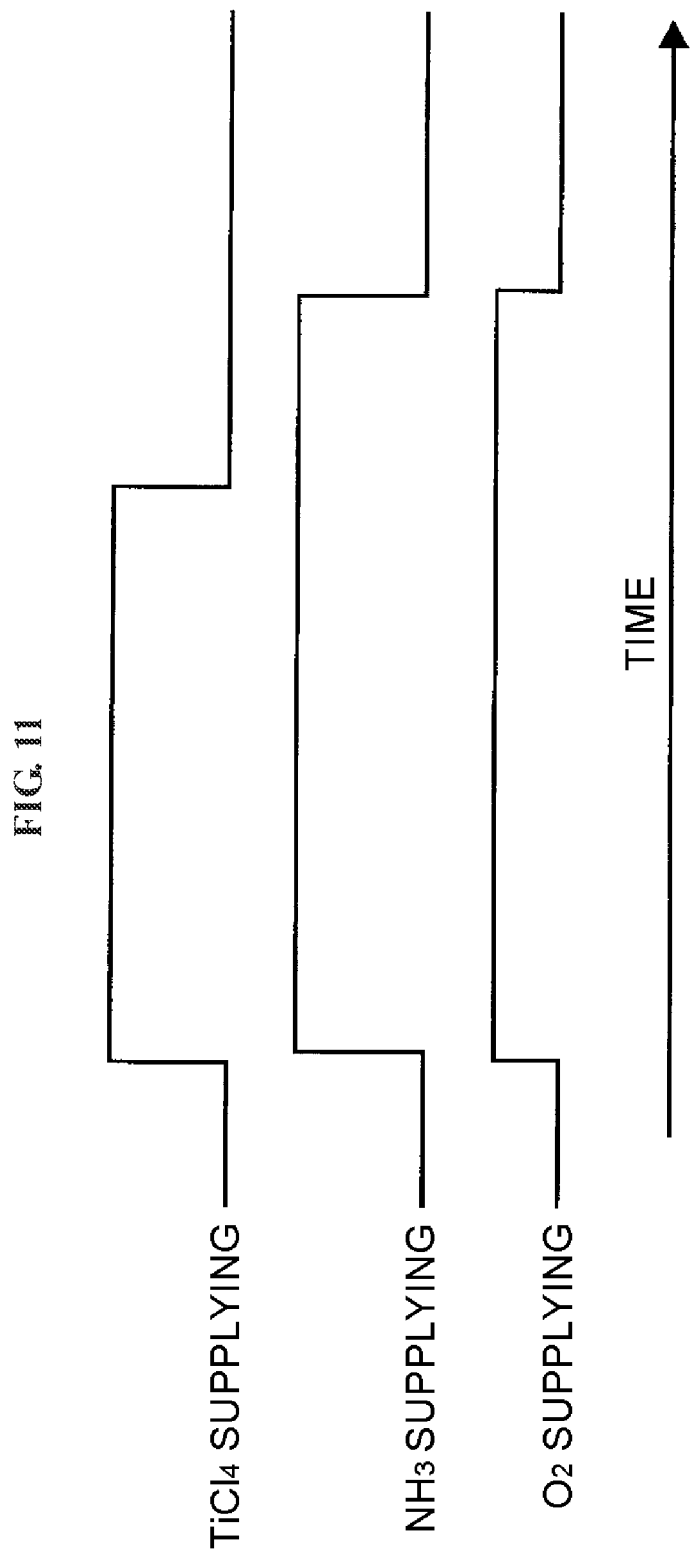
FIG. 11 is a timing chart showing a fourth variant of the film-forming process in the first embodiment of the present invention.

FIG. 11 is a timing chart showing a fourth variant of the film-forming sequence in the film-forming process in accordance with the embodiment. As shown in FIG. 11, in the fourth variant, a process of supplying $TiCl_4$ gas, which is a metal-containing gas, and a process of supplying $NH_3$ gas, which is a nitrogen-containing gas, are performed while a process of supplying $O_2$ gas, which is an oxygen-containing gas, is performed. In addition, in the fourth variant, the process of supplying $TiCl_4$ gas, which is a metal-containing gas, and the process of supplying $NH_3$ gas, which is a nitrogen-containing gas, are simultaneously performed. Here, supply periods of the $TiCl_4$ gas. $NH_3$ gas and $O_2$ gas supplied into the processing chamber 201 may overlap each other, and timings of supply initiation and supply stoppage may not be equal to each other.

For example, in FIG. 11, the process of supplying $TiCl_4$ gas, which is a metal-containing gas, the process of supplying $NH_3$ gas, which is a nitrogen-containing gas, and the process of supplying $O_2$ gas, which is an oxygen-containing gas, are performed at substantially the same time. After the process of supplying $TiCl_4$ gas, which is a metal-containing gas, is terminated, the process of supplying $NH_3$ gas, which is a nitrogen-containing gas, is terminated, and after the process of supplying $NH_3$ gas, which is a nitrogen-containing gas, is terminated, the process of supplying $O_2$ gas, which is an oxygen-containing gas, is terminated.

Figure 12:
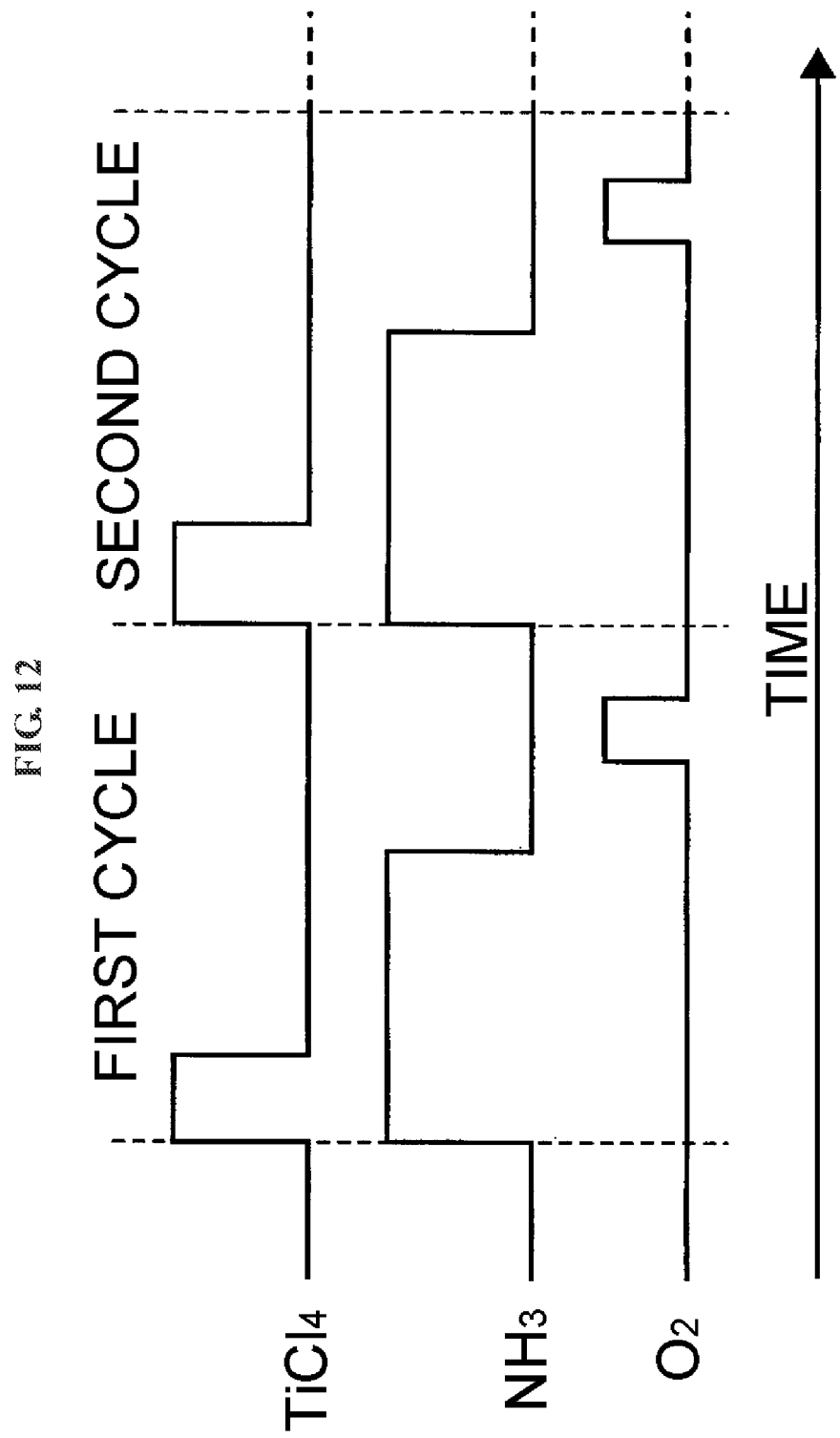
FIG. 12 is a timing chart showing a fifth variant of the film-forming process in the first embodiment of the present invention.

FIG. 12 is a timing chart showing a fifth variant of the film-forming sequence of the TiON film in the film-forming process. In the fifth variant, a process of supplying $TiCl_4$ gas, which is a metal-containing gas, a process of supplying $NH_3$ gas, which is a nitrogen-containing gas, and a process of supplying $O_2$ gas, which is an oxygen-containing gas, are set as one cycle, and the cycle is repeated a plurality of times.

In the fifth variant, the process of supplying $TiCl_4$ gas, which is a metal-containing gas, and the process of supplying $NH_3$ gas, which is a nitrogen-containing gas, are initiated at substantially the same time, and after the process of supplying $TiCl_4$ gas, which is a metal-containing gas, is terminated, the process of supplying $NH_3$ gas, which is a nitrogen-containing gas, is terminated.

Figure 13:
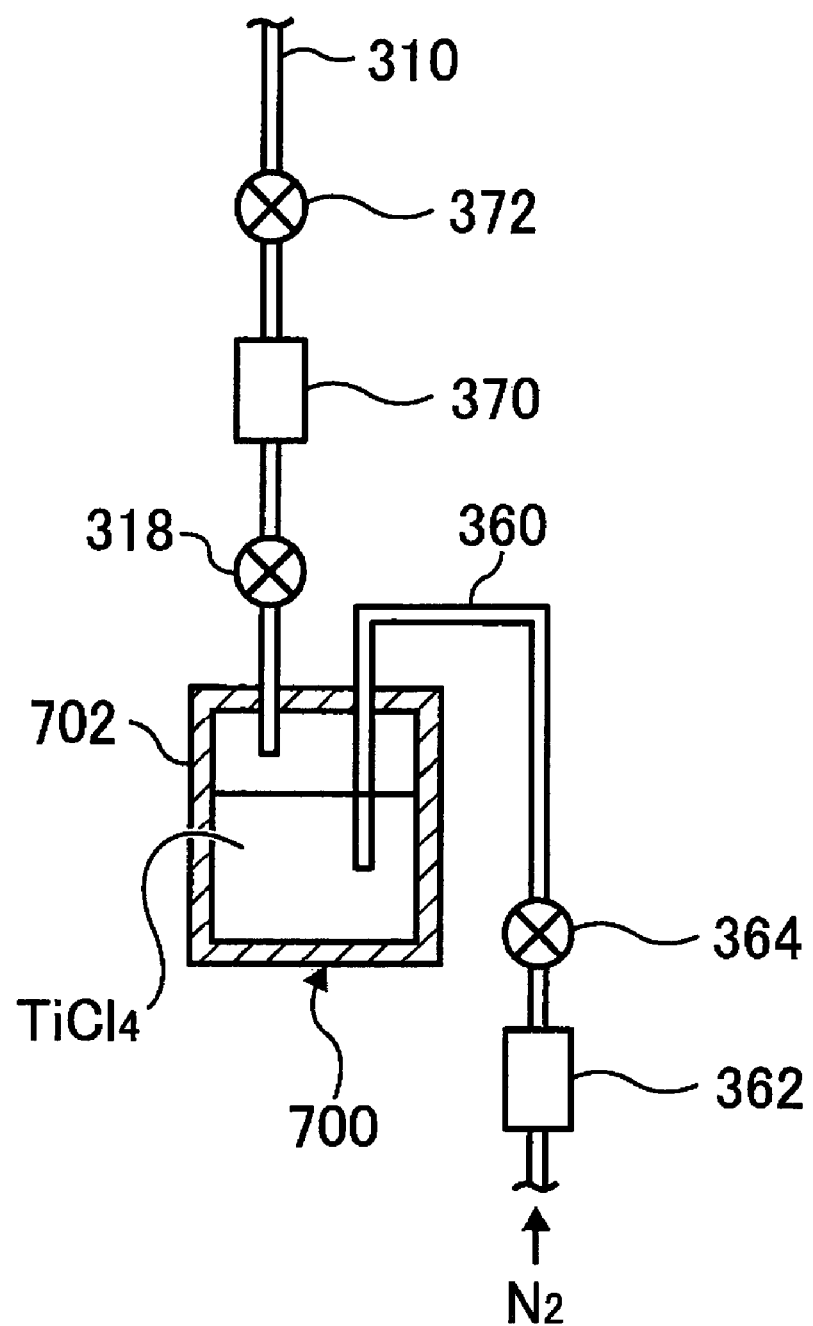
FIG. 13 is a view schematically showing a first variant of the first gas supply system included in the substrate processing apparatus shown in FIG. 1.

FIG. 13 shows a first variant of the first gas supply system 300. The first gas supply system 300 in accordance with the first embodiment as described above includes the first gas supply pipe 310, the bubbler 700, the valve 318 disposed at the gas supply pipe 310 at an upstream side of the bubbler 700, the carrier gas supply pipe 360, the mass flow controller 362 mounted on the carrier gas supply pipe 360, and the valve 364 mounted on the carrier gas supply pipe 360. On the other hand, the first gas supply system 300 in accordance with the first variant includes a mass flow controller 370 and a valve 372, in addition to the respective elements included in the first gas supply system 300 of the first embodiment.

The mass flow controller 370 is mounted on the first gas supply pipe 310 at a downstream side of the valve 318. In addition, the valve 372 is mounted on the first gas supply pipe 310 at a downstream side of the mass flow controller 370. The mass flow controller 370 and the valve 372 are controlled by the controller 900. Further, when a flow rate of the supplied $TiCl_4$ gas is controlled, the mass flow controller 370 is controlled prior to the mass flow controller 362.

The first variant of the first gas supply system 300 has the same configuration as the first gas supply system 300 in the first embodiment, except for the above description, and description of the same configuration will not be repeated.

Figure 14:
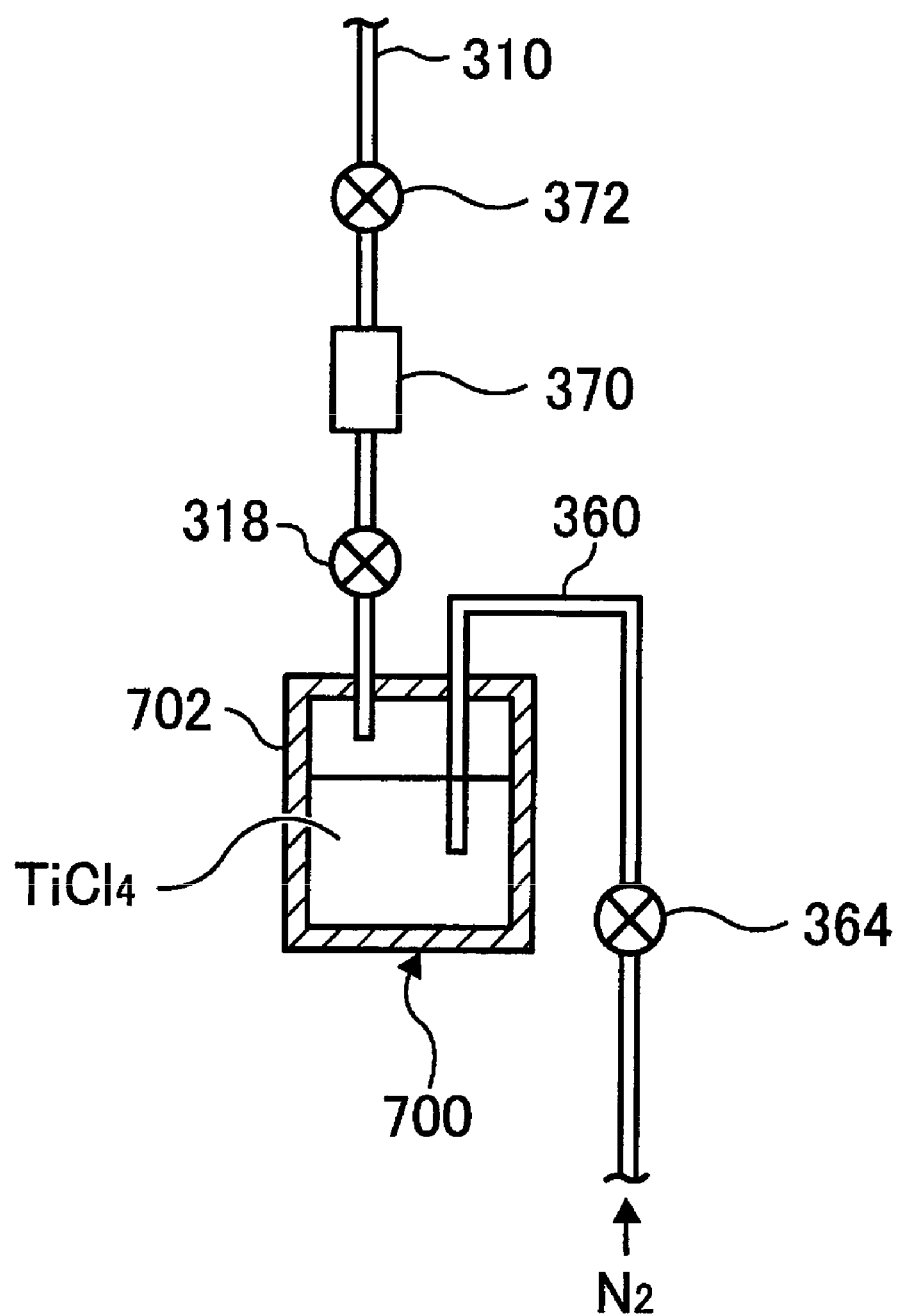
FIG. 14 is a view schematically showing a second variant of the first gas supply system included in the substrate processing apparatus shown in FIG. 1.

FIG. 14 shows a second variant of the first gas supply system 300. The first gas supply system 300 in accordance with the second variant includes a valve 372, in addition to the respective members included in the first gas supply system 300 in accordance with the first embodiment, and includes a mass flow controller 370 instead of the mass flow controller 362.

The mass flow controller 370 is mounted on the first gas supply pipe 310 at a downstream side of the valve 318. In addition, the valve 372 is mounted on the first gas supply pipe 310 at a downstream side of the mass flow controller 370. The mass flow controller 370 and the valve 372 are controlled by the controller 900. Further, when a flow rate of the supplied $TiCl_4$ gas is controlled, the mass flow controller 370 is controlled.

The second variant of the first gas supply system 300 has the same configuration as the first gas supply system 300 in the first embodiment, except for the above description, and description of the same configuration will not be repeated.

Figure 15:
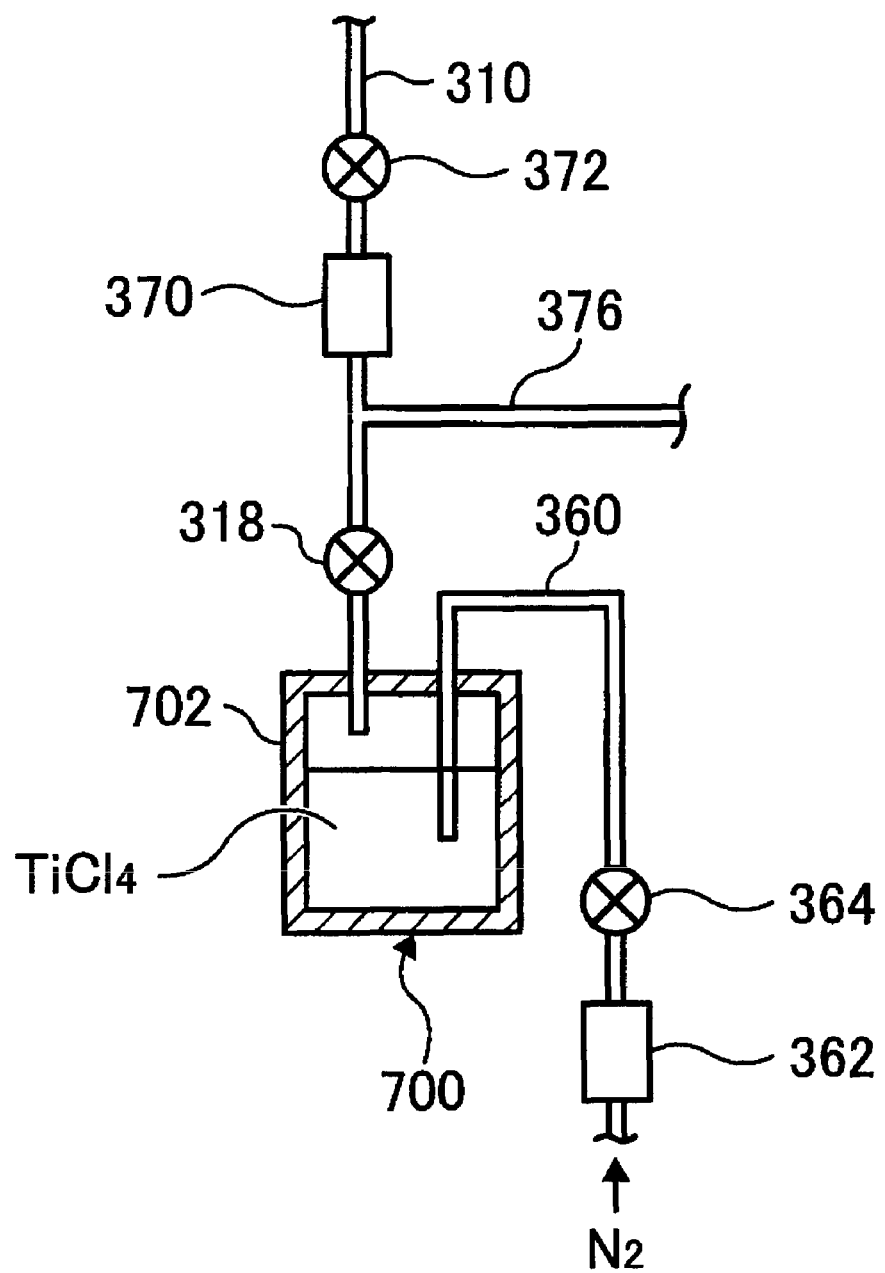
FIG. 15 is a view schematically showing a third variant of the first gas supply system included in the substrate processing apparatus shown in FIG. 1.

FIG. 15 shows a third variant of the first gas supply system 300. The first gas supply system 300 in accordance with the third variant includes a mass flow controller 370, a valve 372, and a vent pipe 376, in addition to the respective members included in the first gas supply system 300 in accordance with the first embodiment.

The mass flow controller 370 is mounted on the first gas supply pipe 310 at a downstream side of the valve 318. In addition, the valve 372 is mounted on the first gas supply pipe 310 at a downstream side of the mass flow controller 370. The mass flow controller 370 and the valve 372 are controlled by the controller 900. When a flow rate of the supplied $TiCl_4$ gas is controlled, the mass flow controller 370 is controlled prior to the mass flow controller 362.

The vent pipe 376 is branched from the first gas supply pipe 310 at a downstream side of the valve 318 and an upstream side of the mass flow controller 370, and connected to the first gas supply pipe 310.

The third variant of the first gas supply system 300 has the same configuration as the first gas supply system 300 in the first embodiment, except for the above description, and description of the same configuration will not be repeated.

Figure 16:
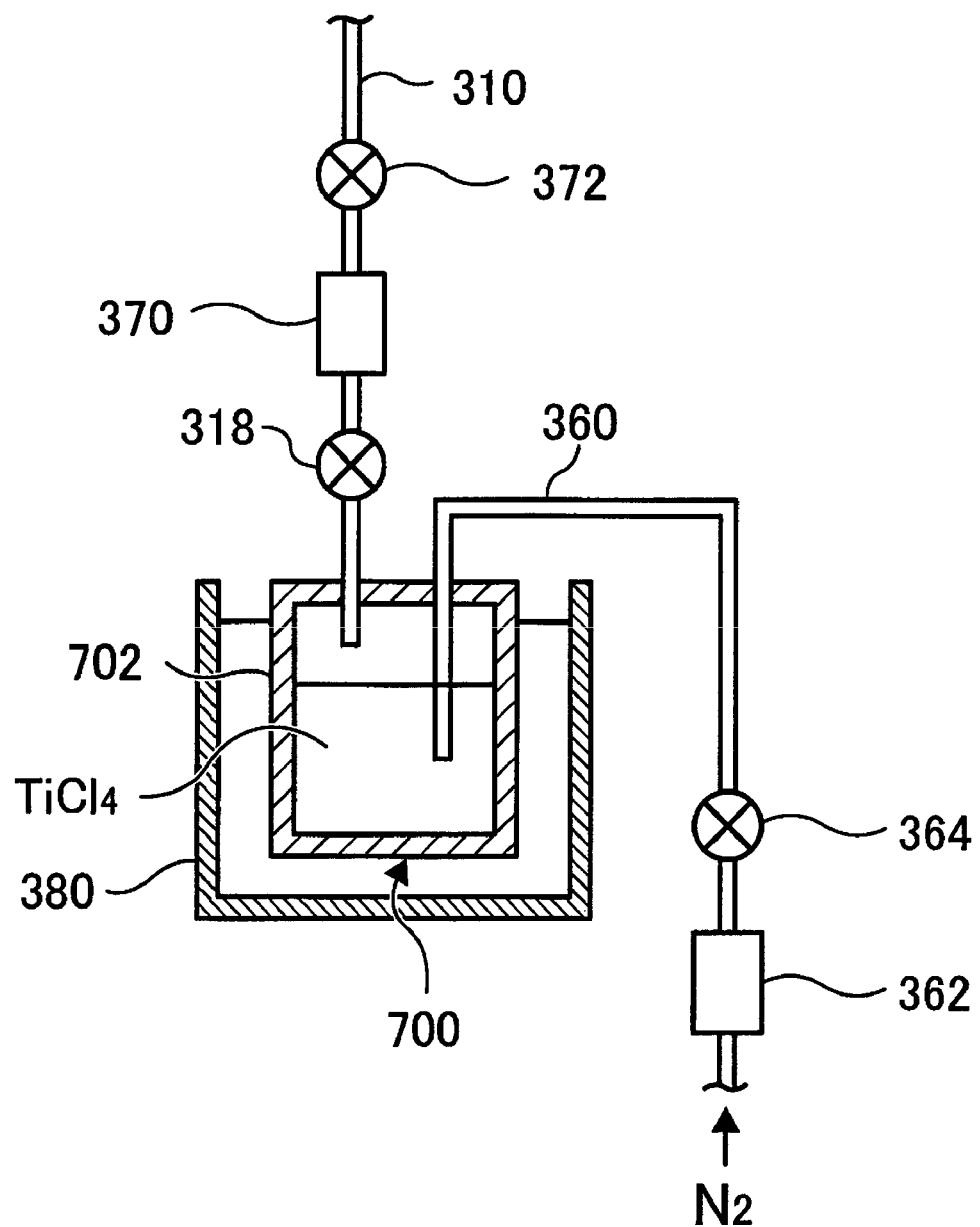
FIG. 16 is a view schematically showing a fourth variant of the first gas supply system included in the substrate processing apparatus shown in FIG. 1.

FIG. 16 shows a third variant of the first gas supply system 300. The first gas supply system 300 in accordance with the fourth variant includes a mass flow controller 370, a valve 372, and a heating tank 380, in addition to the respective members included in the first gas supply system 300 in accordance with the first embodiment.

The mass flow controller 370 is mounted on the first gas supply pipe 310 at a downstream side of the valve 318. In addition, the valve 372 is mounted on the first gas supply pipe 310 at a downstream side of the mass flow controller 370. The mass flow controller 370 and the valve 372 are controlled by the controller 900. Further, when a flow rate of the supplied $TiCl_4$ gas is controlled, the mass flow controller 370 is controlled prior to the mass flow controller 362.

The heating tank 380, which is a constant-temperature tank in which a temperature is constantly maintained, is used as a heating apparatus for heating the bubbler 700, and is configured to surround the bubbler 700, and heat the accommodating vessel 702 to heat the liquid $TiCl_4$ accommodated in the accommodating vessel 702 to easily evaporate the liquid $TiCl_4$.

The fourth variant of the first gas supply system 300 has the same configuration as the first gas supply system 300 in the first embodiment, except for the above description, and description of the same configuration will not be repeated.

Figure 17:
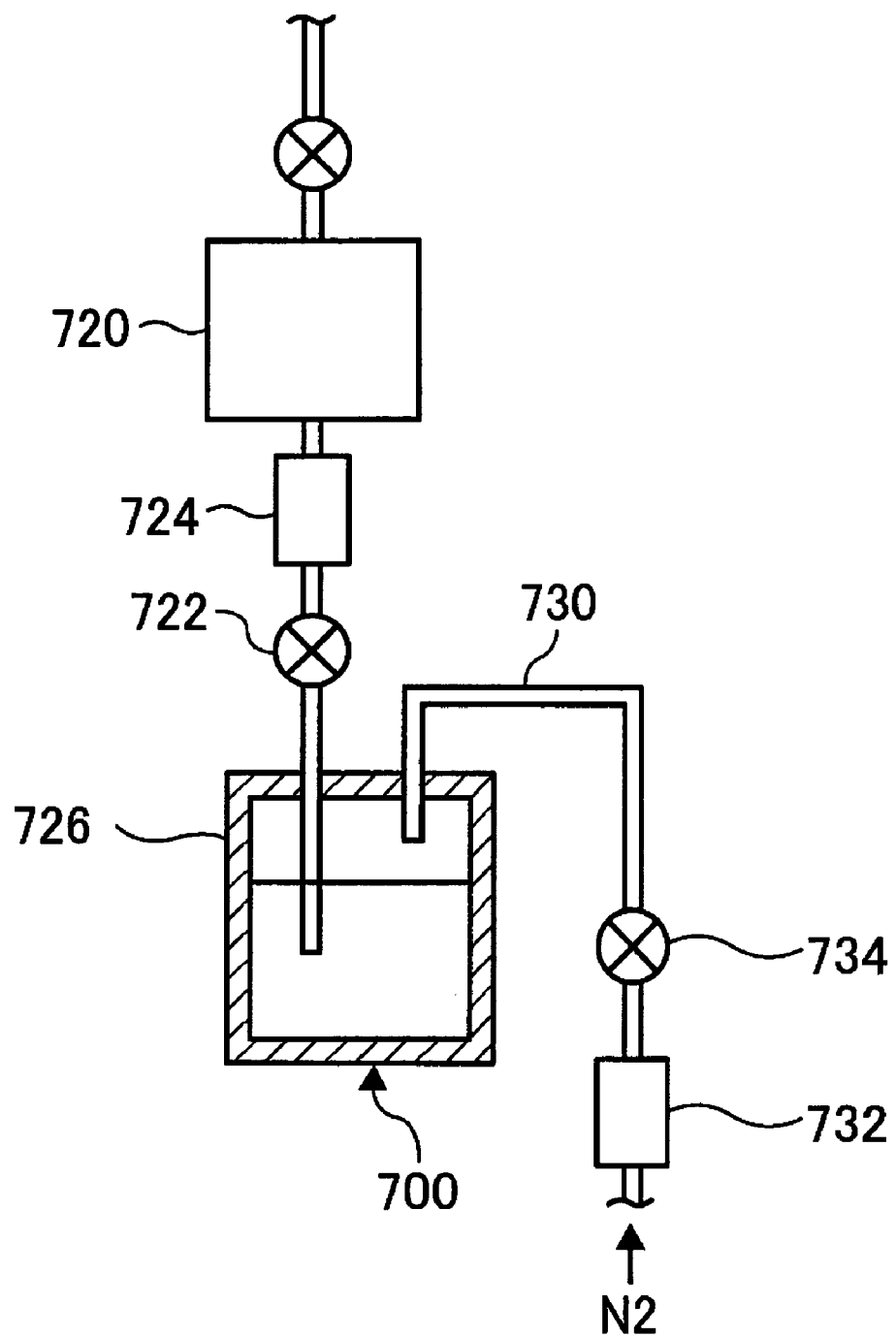
FIG. 17 is a view schematically showing a fifth variant of the first gas supply system included in the substrate processing apparatus shown in FIG. 1.

FIG. 17 shows a fifth variant of the first gas supply system 300. The first gas supply system 300 in accordance with the first embodiment includes the accommodating vessel 702 configured to accommodate a liquid source material, and the bubbler 700 used as an example of an evaporator configured to evaporate the liquid source material through bubbling to generate a source gas. On the other hand, the fifth variant includes an evaporator 720 configured to evaporate a liquid source material or various metal source materials dissolved in a solvent. The evaporator 720 is used as an example of an evaporator configured to generate a source gas.

The accommodating vessel 726 is connected to the evaporator 720 via a valve 722 and a liquid mass flow controller 724. The accommodating vessel 726 accommodates a liquid source material or various metal source materials dissolved in a solvent, and the liquid source material or various metal source materials dissolved in the solvent are supplied into the evaporator 720 from the accommodating vessel 726 via the valve 722 and the liquid mass flow controller.

A carrier gas supply pipe 730 is connected to the accommodating vessel 726, and a mass flow controller 732 and a valve 734 are mounted on the carrier gas supply pipe 730.

In the fifth variant, the evaporator 720, the valve 722, the liquid mass flow controller 724, the mass flow controller 732 and the valve 734 are controlled by the controller 900.

The fifth variant of the first gas supply system 300 has the same configuration as the first gas supply system 300 in the first embodiment, except for the above description, and description of the same configuration will not be repeated.

Figure 18:
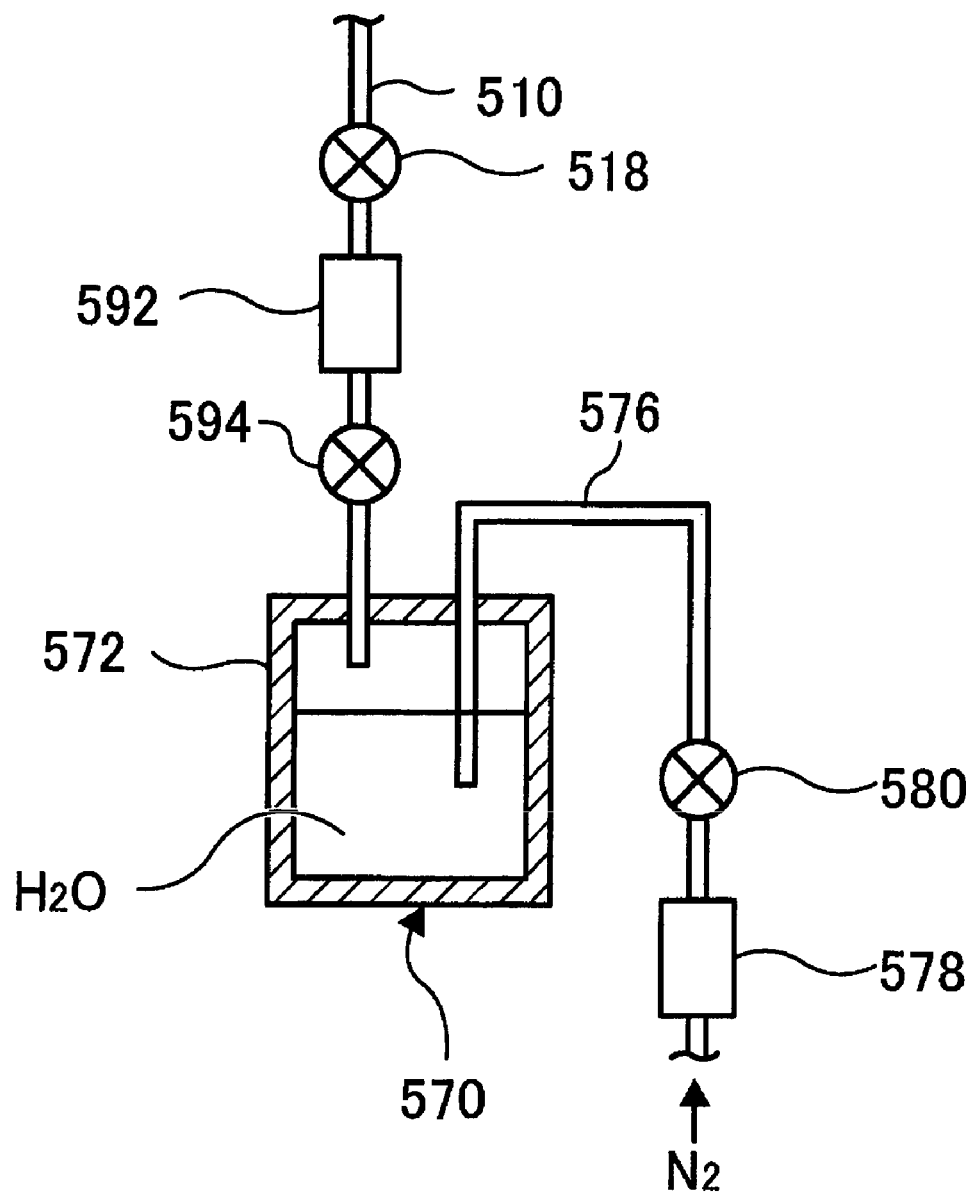
FIG. 18 is a view schematically showing a variant of the third gas supply system included in the substrate processing apparatus shown in FIG. 1.

FIG. 18 shows a variant of the third gas supply system 500. In the first gas supply system 300 in accordance with the first embodiment, an $O_2$ (oxygen) gas supply source (not shown) is connected to an upstream side end of the third gas supply pipe 510, and $O_2$ gas supplied from the $O_2$ gas supply source is used as an oxygen-containing gas supplied into the processing chamber 201. In the variant, a bubbler 570 is mounted on an upstream side end of the third gas supply pipe 510, and vapor supplied from the bubbler 570 is used as an oxygen-containing gas.

The bubbler 570 includes an accommodating vessel 572 configured to accommodate $H_2O$ (water), and evaporates water through bubbling to generate vapor. The accommodating vessel 572 is a sealed vessel, and $H_2O$ is accommodated in the accommodating vessel 572. A carrier gas supply pipe 576 is connected to the accommodating vessel 572, and a mass flow controller 578 and a valve 580 are mounted on the carrier gas supply pipe 576.

In the variant, a mass flow controller 592 is mounted on the third gas supply pipe 510 at an upstream side of the valve 518, and a valve 594 is mounted on the third gas supply pipe 510 at an upstream side of the mass flow controller 592. The mass flow controller 578, the valve 580, the mass flow controller 592 and the valve 594 are controlled by the controller 900.

The variant of the third gas supply system 500 has the same configuration as the third gas supply system 500 in the first embodiment, except for the above description, and description of the same configuration will not be repeated.

The respective variants as described above may be combined and used. That is, one of the first to third variants of the sequence of the first film-forming process, the variant of the sequence of the second film-forming process, one of the first to fifth variants of the first gas supply system, and the variant of the third gas supply system may be combined to be used.

Figure 19:
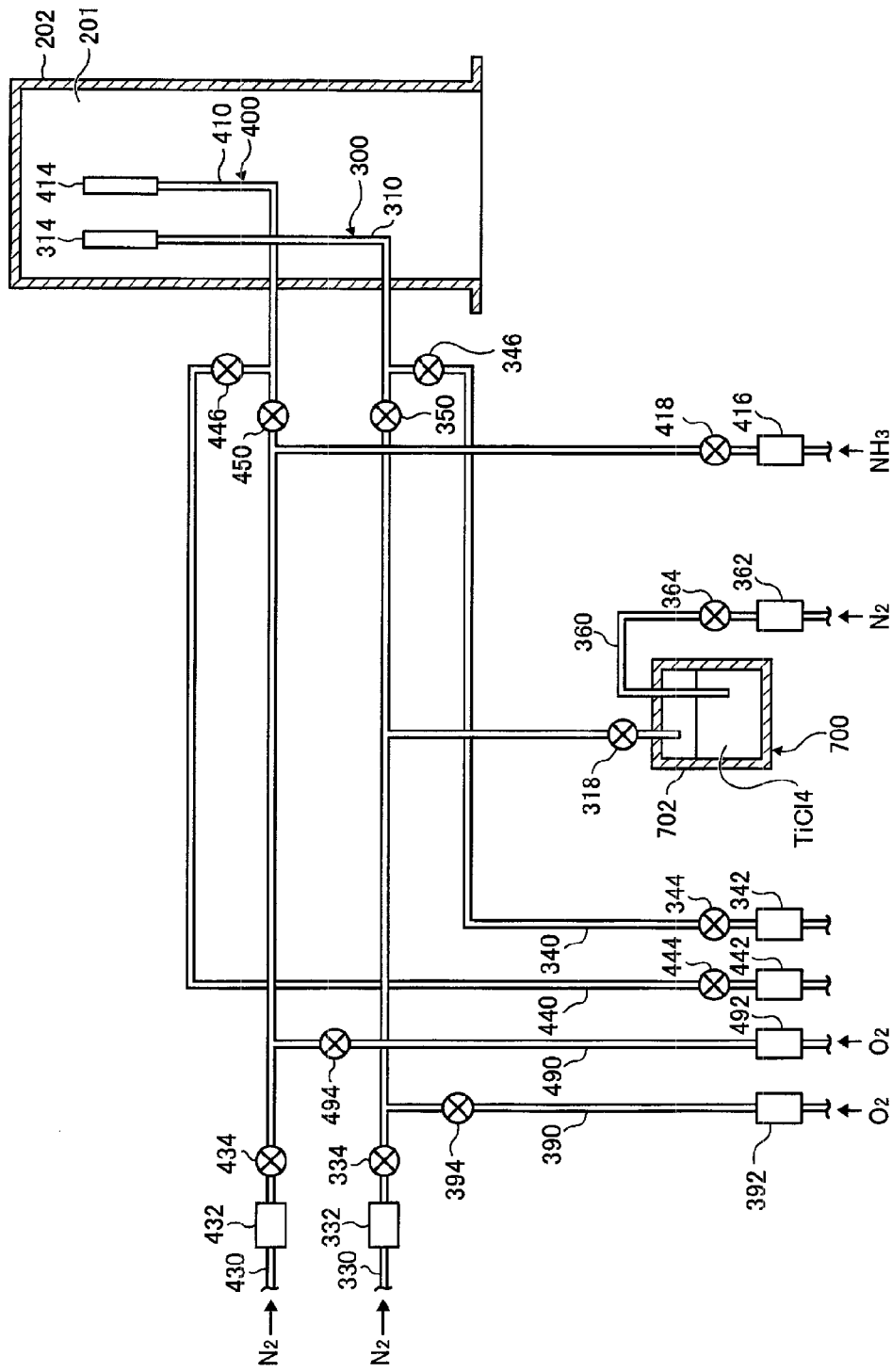
FIG. 19 is a view schematically showing a first gas supply system and a second gas supply system included in a substrate processing apparatus in accordance with a second exemplary embodiment of the present invention.

FIG. 19 schematically shows the first gas supply system and the second gas supply system included in the substrate processing apparatus 101 in accordance with the second embodiment of the present invention.

The substrate processing apparatus 101 in accordance with the first embodiment includes the first gas supply system 300, the second gas supply system 400 and the third gas supply system 500. The first gas supply system 300 is used as an example of the first gas supply system configured to supply a metal-containing gas into the processing chamber 201, the second gas supply system 300 is used as an example of the second gas supply system configured to supply a nitrogen-containing gas into the processing chamber 201, and the third gas supply system 500 is used as an example of the third gas supply system configured to supply a nitrogen-containing gas or a halogen-containing gas into the processing chamber 201. On the other hand, in the second embodiment, the first gas supply system 300 is used as an example of the first gas supply system configured to supply a metal-containing gas into the processing chamber 201, and simultaneously, also used as the third gas supply system configured to supply a nitrogen-containing gas or a halogen-containing gas into the processing chamber 201. In addition, in the second embodiment, the second gas supply system 400 is used as an example of the second gas supply system configured to supply a nitrogen-containing gas into the processing chamber 201, and simultaneously, also used as the third gas supply system configured to supply a nitrogen-containing gas or a halogen-containing gas into the processing chamber 201.

In the second embodiment, the first gas supply system 300 includes an oxygen supply pipe 390, a mass flow controller 392 and a valve 394, in addition to the members included in the first gas supply system 300 of the first embodiment. A downstream side end of the oxygen supply pipe 390 is connected to the first gas supply pipe 310 via the carrier gas supply pipe 330. In addition, an $O_2$ (oxygen) gas supply source (not shown) is connected to an upstream side end of the oxygen supply pipe 390.

The mass flow controller 392 is used to adjust a flow rate of the supplied $O_2$ (oxygen) gas, and mounted on the oxygen supply pipe 390. The valve 394 is used to stop and initiate supply of the $O_2$ (oxygen) gas, and mounted on the oxygen supply pipe 390 at a downstream side of the mass flow controller 392.

In addition, in the second embodiment, the second gas supply system 400 includes an oxygen supply pipe 490, a mass flow controller 492 and a valve 494, in addition to the members included in the second gas supply system 400 of the first embodiment. A downstream side end of the oxygen supply pipe 490 is connected to the fourth gas supply pipe 410 via the carrier gas supply pipe 430. In addition, an $O_2$ (oxygen) gas supply source (not shown) is connected to an upstream side end of the oxygen supply pipe 490.

The mass flow controller 492 is used to adjust a flow rate of the supplied $O_2$ (oxygen) gas, and mounted on the oxygen supply pipe 490. The valve 494 is used to stop and initiate supply of the $O_2$ (oxygen) gas, and mounted on the oxygen supply pipe 490 at a downstream side of the mass flow controller 492. The mass flow controller 392, the valve 394, the mass flow controller 492 and the valve 494 are controlled by the controller 900.

In addition, in the substrate processing apparatus 101 in accordance with the second embodiment of the present invention, one of the first to fifth variants of the first gas supply system 300 in the first embodiment may be used as the first gas supply system 300.

The substrate processing apparatus 101 in accordance with the second embodiment is the same as the substrate processing apparatus 101 in accordance with the first embodiment, except the configuration as described above, and description of the same configuration will not be repeated.

Figure 20:
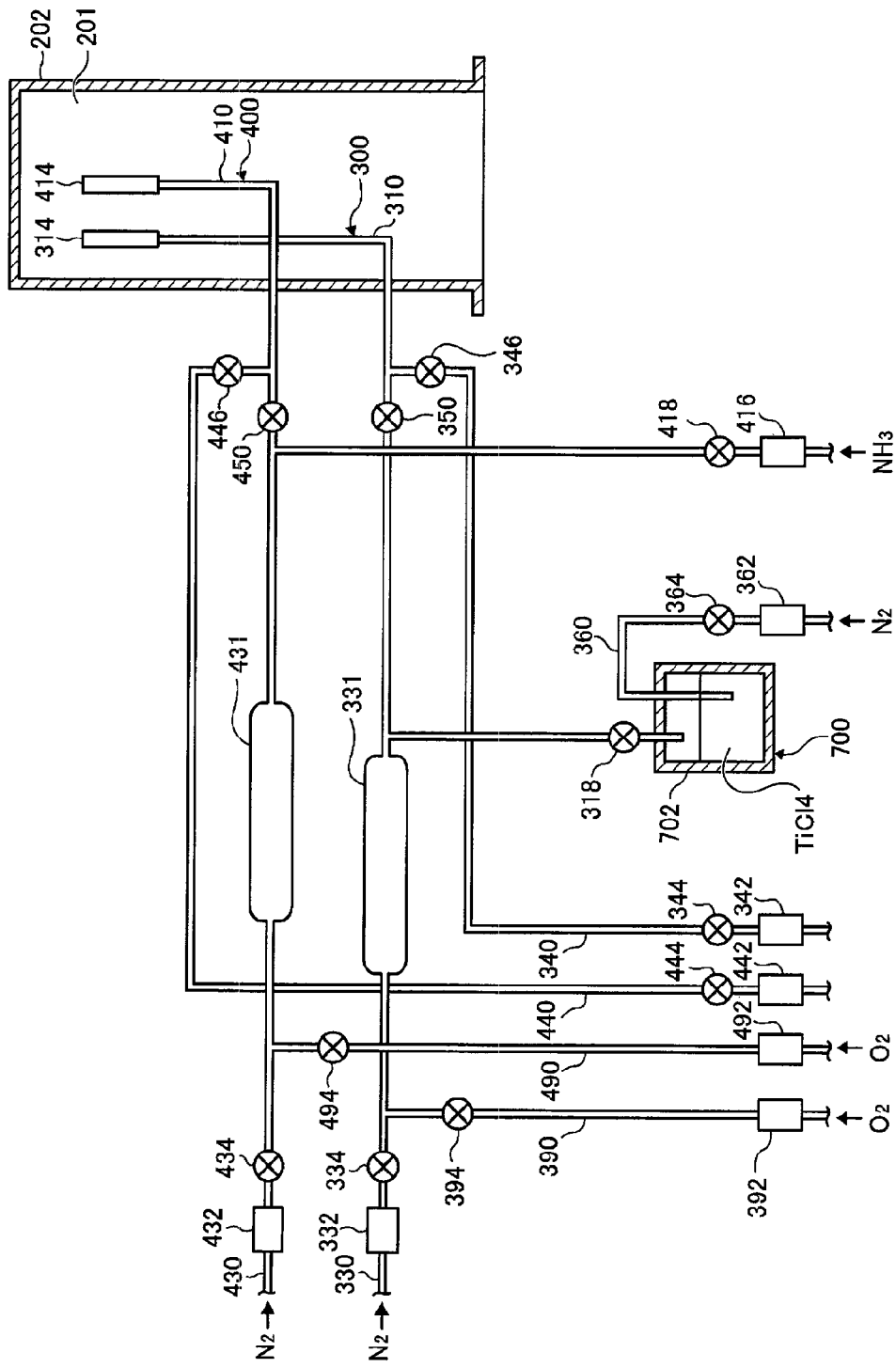
FIG. 20 is a view schematically showing a first variant of the first gas supply system and the second gas supply system included in the substrate processing apparatus in accordance with the second exemplary embodiment of the present invention.

FIG. 20 schematically shows a first variant of the first gas supply system 300 and the second gas supply system 400 included in the substrate processing apparatus 101 in accordance with the second embodiment of the present invention. In the first variant, in addition to the configurations included in the first gas supply system and the second gas supply system in the second embodiment of the present invention, a large diameter part 331 having an inner diameter larger than the other parts is formed in the carrier gas supply pipe 330. The large diameter part 331 is formed at the carrier gas supply pipe 330 at a downstream side of a position to which the oxygen supply pipe 390 is connected, and $O_2$ gas is uniformly diffused to a carrier gas as the carrier gas and $O_2$ gas pass through the large diameter part 331.

In addition, in the first variant, in addition to the configurations included in the first gas supply system and the second gas supply system in the second embodiment of the present invention, a large diameter part 431 having an inner diameter larger than the other parts is formed in the carrier gas supply pipe 430. The large diameter part 431 is formed at the carrier gas supply pipe 430 at a downstream side of a position to which the oxygen supply pipe 490 is connected, and $O_2$ gas is uniformly diffused to a carrier gas as the carrier gas and $O_2$ gas pass through the large diameter part 431. The first variant of the first gas supply system 300 and the second gas supply system 400 is the same as the second embodiment, except for the configuration as described above, and description of the same configuration will not be repeated.

Figure 21:
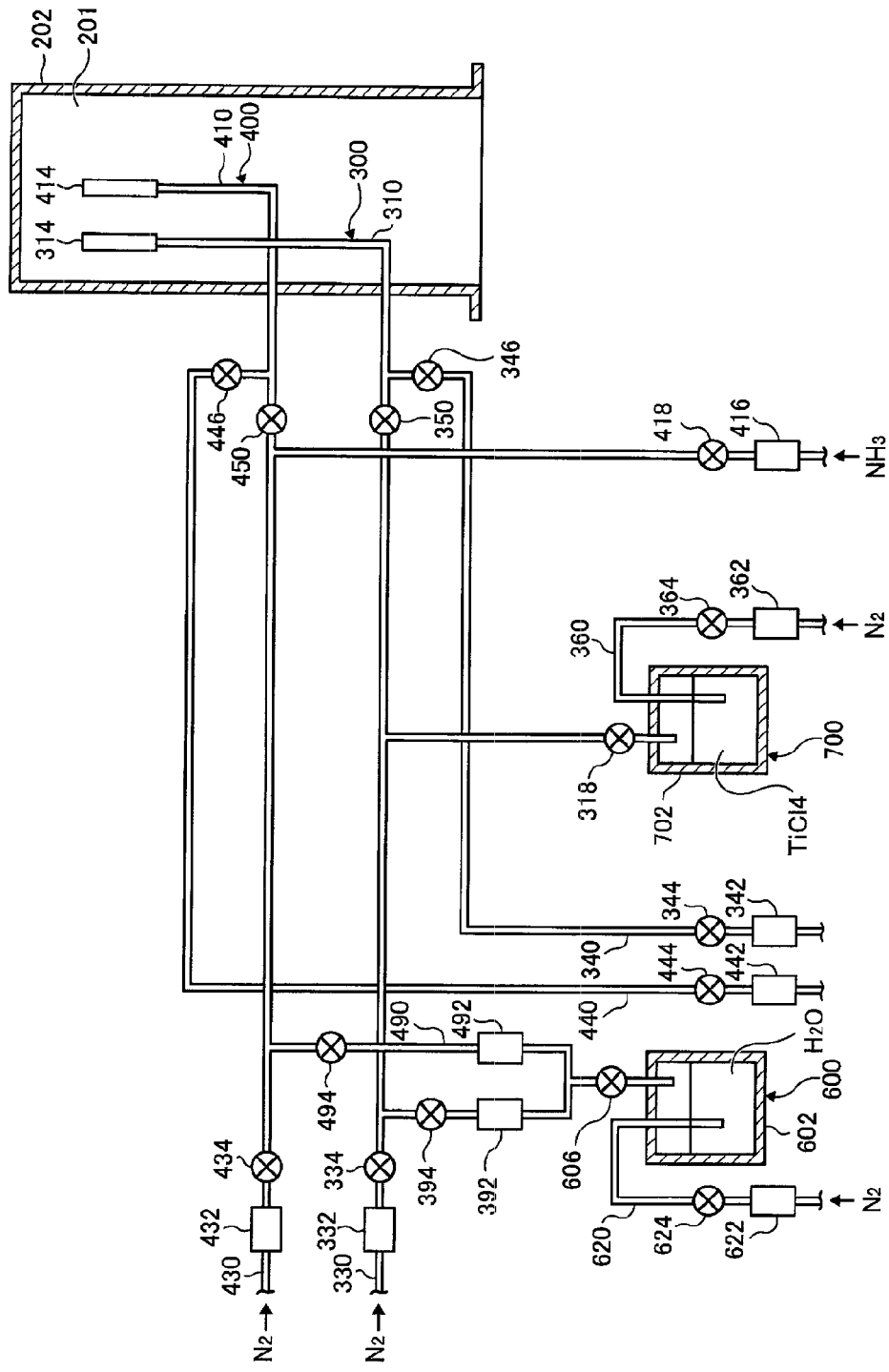
FIG. 21 is a view schematically showing a second variant of the first gas supply system and the second gas supply system included in the substrate processing apparatus in accordance with the second exemplary embodiment of the present invention.

FIG. 21 schematically shows a second variant of the first gas supply system 300 and the second gas supply system 400 included in the substrate processing apparatus 101 in accordance with the second embodiment of the present invention. In the first gas supply system 300 and the second gas supply system 400 in accordance with the second embodiment of the present invention, $O_2$ (oxygen) gas supply sources (not shown) are connected to upstream side ends of the oxygen supply pipe 390 and the oxygen supply pipe 490, respectively, and $O_2$ gas supplied from the $O_2$ gas supply sources is used as an oxygen-containing gas supplied into the processing chamber 201. On the other hand, in the second variant, one bubbler 660 is mounted on the upstream side ends of the oxygen supply pipe 390 and the oxygen supply pipe 490, and vapor supplied from the bubbler 600 is used as an oxygen-containing gas.

The bubbler 600 includes an accommodating vessel 602 configured to accommodate $H_2O$ (water), and evaporate the water through bubbling to generate vapor. The accommodating vessel 602 is a sealed vessel, and H$_2$O is accommodated in the accommodating vessel 602. A carrier gas supply pipe 620 is connected to the accommodating vessel 602, and a mass flow controller 622 and a valve 624 are mounted on the carrier gas supply pipe 620.

In addition, in the second variant, the oxygen supply pipe 390 and the oxygen supply pipe 490 are connected to each other at an upstream side, a mass flow controller 606 is mounted on the connected portion, and the connected portion is connected to the bubbler 600. The mass flow controller 606, the valve 624 and the mass flow controller 622 are controlled by the controller 900. The second variant of the first gas supply system 300 and the second gas supply system 400 is the same as the second embodiment, except for the configuration as described above, and description of the same configuration will not be repeated.

In the first embodiment, the second embodiment and the variants thereof, while the vapor is exemplarily used as O$_2$ gas, which is an oxygen-containing gas, instead of O$_2$ gas and vapor, or in combination of O$_2$ gas and vapor, for example, NO, N$_2$O, O$_3$, etc. may be used as the oxygen-containing gas.

In addition, in the first embodiment, the second embodiment and the variants thereof, while the oxygen-containing gas is supplied into the processing chamber 201, in addition to supply of the oxygen-containing gas into the processing chamber 201, a halogen-containing gas may be supplied into the processing chamber 201. For example, a gas containing fluorine or chlorine may be used as the halogen-containing gas supplied into the processing chamber 201.

As the halogen-containing gas instead of the oxygen-containing gas is supplied into the processing chamber 201, an increase in electric resistance of a conductive thin film can be suppressed, electro-negativity of the conductive thin film can be increased, and as a result, a work function of the conductive thin film can be increased.

In addition, as an addition method, a supply time and a concentration of the oxygen-containing gas or the halogen-containing gas are varied, a ratio of oxygen included in the formed film can be controlled to a desired value.

EXEMPLARY EMBODIMENTS OF THE INVENTION

Hereinafter, exemplary embodiments of the present invention will be additionally stated.

[Supplementary Note 1]

A semiconductor device manufacturing method of forming a metal-containing film on a substrate, the method including:

(a) supplying a metal-containing gas into a processing chamber where the substrate is accommodated:

(b) supplying a nitrogen-containing gas into the processing chamber; and (c) supplying the metal-containing gas and the nitrogen-containing gas into the processing chamber, and supplying one of an oxygen-containing gas, a halogen-containing gas and a combination thereof into the processing chamber.

[Supplementary Note 2]

The semiconductor device manufacturing method according to Supplementary Note 1, wherein steps (a), (b) and (c) are set as one cycle, and the cycle is repeated a plurality of times.

[Supplementary Note 3]

The semiconductor device manufacturing method according to Supplementary Note 2, further including (d) removing the gas remaining in the processing chamber from the processing chamber, wherein step (d) is performed at least one of between step (a) and step (b), between step (b) and step (c), and after step (c), and before step (a).

[Supplementary Note 4]

The semiconductor device manufacturing method according to Supplementary Note 1, wherein step (a) and step (b) are set as one cycle, the cycle is performed a plurality of times, and then step (c) is performed.

[Supplementary Note 5]

The semiconductor device manufacturing method according to Supplementary Note 4, further including (d) removing the gas remaining in the processing chamber from the processing chamber, wherein step (d) is performed at least one of between step (a) and step (b), between step (b) and step (c), and after step (c), and before step (a).

[Supplementary Note 6]

A semiconductor device manufacturing method of forming a metal-containing film on a substrate, the method including:

(a) supplying a metal-containing gas into a processing chamber where the substrate is accommodated;

(b) supplying a nitrogen-containing gas into the processing chamber; and (c) supplying one of an oxygen-containing gas, a halogen-containing gas and a combination thereof into the processing chamber, wherein at least one of step (a) and step (b) is performed while step (c) is performed.

[Supplementary Note 7]

The semiconductor device manufacturing method according to Supplementary Note 6, wherein while step (c) is performed, step (a) and step (b) are alternately performed a plurality of times.

[Supplementary Note 8]

The semiconductor device manufacturing method according to Supplementary Note 6, wherein step (a) and step (b) are simultaneously performed.

[Supplementary Note 9]

The semiconductor device manufacturing method according to one of Supplementary Notes 1 to 8, wherein an oxygen content or a halogen content of the metal-containing film formed on the substrate is controlled in at least one of the steps (a), (b) and (c) to be at a predetermined level.

[Supplementary Note 10]

The semiconductor device manufacturing method according to Supplementary Note 9, wherein, in step (c), a supply amount of the oxygen-containing gas or the halogen-containing gas is controlled such that the oxygen content or the halogen content of the metal-containing film formed on the substrate is at the predetermined level.

[Supplementary Note 11]

A substrate processing apparatus including:

a processing chamber configured to accommodate a substrate;

a first gas supply system configured to supply a metal-containing gas into the processing chamber;

a second gas supply system configured to supply a nitrogen-containing gas into the processing chamber;

a third gas supply system configured to supply one of an oxygen-containing gas, a halogen-containing gas and a combination thereof into the processing chamber; and a control unit configured to control the first gas supply system, the second gas supply system and the third gas supply system, wherein the control unit controls the first gas supply system, the second gas supply system and the third gas supply system such that an oxygen content or a halogen content of a metal-containing film formed on the substrate is at a predetermined level.

[Supplementary Note 12]

The substrate processing apparatus according to Supplementary Note 11, wherein the control unit controls the first gas supply system, the second gas supply system and the third gas supply system such that supply of the metal-containing gas into the processing chamber, supply of the nitrogen-containing gas into the processing chamber, and supply of one of the oxygen-containing gas, the halogen-containing gas and a combination thereof are set as one cycle and the cycle is repeated a plurality of times, and controls a supply amount of the oxygen-containing gas or the halogen-containing gas into the processing chamber by the third gas supply system such that the oxygen content or the halogen content of the metal-containing film formed on the substrate is at the predetermined level.

[Supplementary Note 13]

The substrate processing apparatus according to Supplementary Note 12, wherein the third gas supply system further includes:

a flow rate control mechanism configured to control a flow rate of the oxygen-containing gas or the halogen-containing gas; and an opening/closing valve installed between the flow rate control mechanism and the processing chamber.

[Supplementary Note 14]

A method of forming a thin film, including:

a metal material supply process of supplying a metal material into a processing chamber, in which a substrate is accommodated, to form the thin film on the substrate;

a first supply process of supplying a first source material into the processing chamber to process at least one of reduction and nitridation of the metal material; and a second supply process of supplying a second source material into the processing chamber to process at least one of oxidation and halogenation of the metal material, wherein, in the second supply process, a flow rate of the second source material is controlled such that an introduction amount of oxygen or a halogen introduced into the thin film formed on the substrate becomes a predetermined value.

[Supplementary Note 15]

The method of forming a thin film according to Supplementary Note 14, wherein the second supply process includes:

a process of enabling supply of the second source material into the processing chamber using a valve; and a process of stopping supply of the second source material into the processing chamber using the valve.

[Supplementary Note 16]

The method of forming a thin film according to Supplementary Note 14 or 15, wherein, in the second supply process, a flow rate of the second source material is independently controlled from a flow rate of another material supplied into the second supply system.

[Supplementary Note 17]

The method of forming a thin film according to one of Supplementary Notes 14 to 16, wherein, in the first supply process, the first source material is mixed with an inert gas and supplied, and in the second supply process, the second source material is mixed with the inert gas and supplied.

[Supplementary Note 18]

The method of forming a thin film according to Supplementary Note 17, further including:

a process of uniformly mixing the first source material and the inert gas; and a process of uniformly mixing the second source material and the inert gas.

[Supplementary Note 19]

The method of forming a thin film according to one of Supplementary Notes 14 to 18, wherein the second supply process further includes at least one of a bubble generating process of generating bubbles in water accommodated in a water accommodating part; and an evaporating process of evaporating the water accommodated in the water accommodating part.

[Supplementary Note 20]

The method of forming a thin film according to one of Supplementary Notes 14 to 19, wherein the metal material supply process includes at least one of a process of mixing the metal material formed of a liquid material accommodated in a metal material accommodating part with a carrier gas; a process of heating the metal material formed of a liquid material accommodated in the metal material accommodating part; and a process of evaporating the metal material formed of a liquid material accommodated in the metal material accommodating part.

[Supplementary Note 21]

A thin film forming apparatus including:

a processing chamber configured to accommodate a substrate;

a metal material supply system configured to supply a metal material into the processing chamber to form a thin film on the substrate;

a first supply system configured to supply a first source material into the processing chamber to process at least one of reduction and nitridation of the metal material; and a second supply system configured to supply a second source material to process at least one of oxidation and halogenation of the metal material, wherein the second supply system includes a flow rate control mechanism configured to control a flow rate of the second source material, and the flow rate control mechanism controls a flow rate of the second source material such that an introduction amount of oxygen or a halogen introduced into the thin film formed on the substrate becomes a predetermined value.

[Supplementary Note 22]

The thin film forming apparatus according to Supplementary Note 21, wherein the second supply system further includes a valve configured to enable supply of the second source material into the processing chamber and stop supply of the second source material into the processing chamber.

[Supplementary Note 23]

The thin film forming apparatus according to Supplementary Note 21 or 22, wherein the flow rate control mechanism independently controls a flow rate of the second source material from a flow rate of another material supplied into the second supply system.

[Supplementary Note 24]

A thin film forming apparatus including:

a processing chamber configured to accommodate a substrate;

a metal material supply system configured to supply a metal material into the processing chamber to form a thin film on the substrate; and a first supply system configured to supply a first source material into the processing chamber to process at least one of reduction and nitridation of the metal material, wherein the metal material supply system includes a first inert gas supply pipe configured to supply an inert gas into the metal gas supply system, the first supply system includes a second inert gas supply pipe configured to supply the inert gas into the first supply system, further including a second supply system configured to supply a second source material to process at least one of oxidation and halogenation of the metal material into one of the first inert gas supply pipe and the second inert gas supply pipe, wherein the second supply system includes a flow rate control mechanism configured to control a flow rate of the second source material, and the flow rate control mechanism controls a flow rate of the second source material such that an introduction amount of oxygen or a halogen introduced into the thin film formed on the substrate becomes a predetermined value.

[Supplementary Note 25]

The thin film forming apparatus according to Supplementary Note 24, wherein the first inert gas supply pipe includes a first large diameter part having a larger inner diameter than that of other parts, and the second inert gas supply pipe includes a second large diameter part having a larger inner diameter than that of the other parts.

[Supplementary Note 26]

The thin film forming apparatus according to one of Supplementary Notes 21 to 25, wherein the second supply system further includes:

a water accommodating part configured to accommodate water; and at least one of a bubble generating apparatus configured to generate bubbles from the water accommodated in the water accommodating part and an evaporating apparatus configured to evaporate the water accommodated in the water accommodating part.

[Supplementary Note 27]

The thin film forming apparatus according to one of Supplementary Notes 21 to 26, wherein the metal material supply system includes:

a metal material accommodating part configured to accommodate the metal material formed of a liquid material; and at least one of a mixing apparatus configured to mix the metal material accommodated in the metal material accommodating part with a carrier gas, a heating apparatus configured to heat the metal material accommodated in the metal material accommodating part, and an evaporating apparatus configured to evaporate the metal material accommodated in the metal material accommodating part.

[Supplementary Note 28]

A semiconductor device manufacturing method of forming a metal-containing film on a substrate, the method including repeating a cycle a plurality of times, wherein the cycle includes:

(a) supplying a metal-containing gas into a processing chamber where the substrate is accommodated;

(b) supplying a nitrogen-containing gas into the processing chamber; and (c) supplying one of an oxygen-containing gas, a halogen-containing gas and a combination thereof into the processing chamber.

[Supplementary Note 29]

A semiconductor device manufacturing method, including:

(a) forming a metal nitride film on a substrate by performing a cycle including supplying a metal-containing gas into a processing chamber in which the substrate is accommodated and supplying a nitrogen-containing gas into the processing chamber a plurality of times; and (b) after step (a), performing a process of supplying one of an oxygen-containing gas, a halogen-containing gas and a combination thereof into the processing chamber to add oxygen into the metal nitride film.

[Supplementary Note 30]

A semiconductor device manufacturing method of forming a metal-containing film on a substrate, the method comprising repeating a cycle a plurality of times, wherein the cycle includes:

(a) supplying a metal-containing gas into a processing chamber in which the substrate is accommodated;

(b) supplying a nitrogen-containing gas into the processing chamber; and (c) supplying one of an oxygen-containing gas, a halogen-containing gas and a combination thereof into the processing chamber, wherein at least one of step (a) and step (b) is performed while step (c) is performed.

[Supplementary Note 31]

A substrate processing apparatus including:

a processing chamber configured to accommodate a substrate;

a first gas supply system configured to supply a metal-containing gas into the processing chamber;

a second gas supply system configured to supply a nitrogen-containing gas into the processing chamber;

a third gas supply system configured to supply one of an oxygen-containing gas, a halogen-containing gas and a combination thereof into the processing chamber; and a control unit configured to control the first gas supply system, the second gas supply system and the third gas supply system, wherein the control unit controls the first gas supply system, the second gas supply system and the third gas supply system such that an oxygen content or a halogen content of a metal-containing film formed on the substrate is at a predetermined level.

[Supplementary Note 32]

A substrate processing method of forming a metal-containing film on a substrate, the method including repeating a cycle a plurality of times, wherein the cycle includes:

(a) supplying a metal-containing gas into a processing chamber where the substrate is accommodated;

(b) supplying a nitrogen-containing gas into the processing chamber; and (c) supplying one of an oxygen-containing gas, a halogen-containing gas and a combination thereof into the processing chamber.

[Supplementary Note 33]

A program causing a computer to function as a control unit configured to control a first gas supply system to supply a metal-containing gas of a predetermined amount into a processing chamber in which a substrate is accommodated, control a second gas supply system to supply a nitrogen-containing gas of a predetermined amount into the processing chamber, control a third gas supply system to supply one of an oxygen-containing gas, a halogen-containing gas and a combination thereof of a predetermined amount into the processing chamber; and control an exhaust system configured to exhaust the processing chamber such that the processing chamber is exhausted in a predetermined exhaust amount.

[Supplementary Note 34]

A computer-readable recording medium in which the program according to Supplementary Note 33 is recorded.

What is claimed is:

1. A semiconductor device manufacturing method of forming a metal-containing film on a substrate, the method comprising:
   (a) supplying a metal-containing gas simultaneously with one selected from the group consisting of a halogen-containing gas and a combination of an oxygen-containing gas and the halogen-containing gas into a processing chamber accommodating the substrate; and
   (b) supplying a nitrogen-containing gas with the one selected from the group consisting of the halogen-containing gas and the combination of the oxygen-containing gas and the halogen-containing gas into the processing chamber,
   wherein the metal-containing gas and the nitrogen-containing gas are non-simultaneously supplied.

2. The method according to claim 1, wherein a ratio of halogen element in the metal-containing film or a ratio of oxygen and the halogen element in the metal-containing film is controlled to be at a predetermined value in the step (b) by adjusting a concentration of at least one of the halogen-containing gas and the combination of the oxygen-containing gas and the halogen-containing gas in the step (b).

3. The method according to claim 1, wherein a work function of the metal-containing film is controlled by adjusting a ratio of halogen element in the metal-containing film or a ratio of oxygen and the halogen element in the metal-containing film.

4. A semiconductor device manufacturing method of forming a metal-containing film on a substrate, the method comprising:
   (a) simultaneously supplying a metal-containing gas and a nitrogen-containing gas into a processing chamber accommodating the substrate to react the metal-containing gas with the nitrogen-containing gas; and
   (b) supplying one selected from the group consisting of a halogen-containing gas and a combination of the halogen-containing gas and an oxygen-containing gas into the processing chamber,
   wherein a time duration of supplying the metal-containing gas is shorter than that of the nitrogen-containing gas in the step (a), and the steps (a) and (b) are alternately performed as a temporally separated pulse.

5. The method according to claim 4, a concentration of oxygen in the metal-containing film is controlled by adjusting at least one of a time duration of supplying the oxygen-containing gas and a concentration of the oxygen-containing gas.

6. The method according to claim 5, a work function of the metal-containing film is adjusted by controlling the concentration of oxygen in the metal-containing film.

* * * * *